US011703919B1

(12) United States Patent
Zhong

(10) Patent No.: US 11,703,919 B1
(45) Date of Patent: Jul. 18, 2023

(54) EXPANSION CARD INSTALLATION MODULE AND SERVER

(71) Applicant: Wistron Corporation, New Taipei (TW)

(72) Inventor: Yong-Qing Zhong, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 17/749,178

(22) Filed: May 20, 2022

(30) Foreign Application Priority Data

Apr. 12, 2022 (CN) .......................... 202210380398.0

(51) Int. Cl.
*G06F 1/18* (2006.01)
*H05K 7/14* (2006.01)

(52) U.S. Cl.
CPC ........... *G06F 1/186* (2013.01); *H05K 7/1405* (2013.01); *H05K 7/1418* (2013.01); *H05K 7/1461* (2013.01); *H05K 7/1489* (2013.01)

(58) Field of Classification Search
None
See application file for complete search history.

(56) References Cited

U.S. PATENT DOCUMENTS

| 5,657,204 | A  | * | 8/1997 | Hunt ..................... | H05K 7/1409 |
|           |    |   |        |                           | 361/752     |
| 7,364,447 | B1 | * | 4/2008 | Desrosiers .............. | G06F 1/186  |
|           |    |   |        |                           | 439/372     |
| 2014/0254086 | A1 | * | 9/2014 | Li ......................... | H05K 7/1489 |
|           |    |   |        |                           | 439/64      |
| 2015/0017828 | A1 | * | 1/2015 | Li ......................... | H01R 13/629 |
|           |    |   |        |                           | 439/345     |
| 2015/0131227 | A1 | * | 5/2015 | Howell ................ | H05K 7/1409 |
|           |    |   |        |                           | 211/26      |
| 2021/0385958 | A1 | * | 12/2021 | Yu ........................ | H05K 7/1417 |

OTHER PUBLICATIONS

"Office Action of Taiwan Counterpart Application", dated Oct. 18, 2022, p. 1-p. 11.

* cited by examiner

*Primary Examiner* — James Wu
*Assistant Examiner* — Christopher L Augustin
(74) *Attorney, Agent, or Firm* — JCIPRNET

(57) ABSTRACT

Provided is an expansion card installation module including an expansion-card bracket, an operating element, a stopper, and a driving component. The operating element is pivoted on the expansion-card bracket. The stopper is slidably disposed on the expansion-card bracket and is located at a stop position or a non-stop position. The stopper at the stop position is adapted to stop an expansion card in the expansion-card bracket, and the stopper at the non-stop position releases the expansion card, such that the expansion card is allowed to be removed from the expansion-card bracket. The driving component is movably disposed on the expansion-card bracket. The operating element is adapted to push against the stopper to move the stopper from the stop position to the non-stop position, and the driving component is adapted to position the stopper at the non-stop position. A server is also provided.

16 Claims, 20 Drawing Sheets

EXPANSION CARD INSTALLATION MODULE AND SERVER

CROSS-REFERENCE TO RELATED APPLICATION

This application claims the priority benefit of China application serial no. 202210380398.0, filed on Apr. 12, 2022. The entirety of the above-mentioned patent application is hereby incorporated by reference herein and made a part of this specification.

BACKGROUND

Technical Field

The present disclosure relates to an installation module and a server, particularly to an expansion card installation module and a server including the expansion card installation module.

Description of Related Art

With the development of technology, the demand for the performance of servers is also growing, which leads to the emergence of the expansion-card brackets that accommodate additional expansion cards. Take the conventional graphics processing unit (GPU) expansion card as an example. The body of a conventional GPU expansion card does not have a locking structure and usually weighs more than 1 kg. If the expansion-card bracket is not structurally stable, the expansion card may fail due to poor contact. In addition, the expansion card is usually installed by the client itself. For the convenience of the users, it is necessary to reduce the tools needed during the installation and disassembly, and simplify the installation and removal processes of expansion cards. Therefore, it is a critical issue in the art to reduce the tools for installation and disassembly of expansion cards and improve the convenience thereof.

SUMMARY

The disclosure provides an expansion card installation module and a server capable of installing and removing the expansion card without using additional tools, which saves time and improves the convenience thereof.

The expansion card installation module of the disclosure is adapted to accommodate an expansion card, and the expansion card installation module includes an expansion-card bracket, an operating element, a stopper, and a driving component. The operating element is pivoted on the expansion-card bracket. The stopper is slidably disposed on the expansion-card bracket and is located at a stop position or a non-stop position. The stopper at the stop position stops the expansion card in the expansion-card bracket, and the stopper at the non-stop position releases the expansion card, such that the expansion card is allowed to be removed from the expansion-card bracket. The driving component is movably disposed on the expansion-card bracket. The operating element is adapted to push the stopper to move the stopper from the stop position to the non-stop position, and the driving component is adapted to position the stopper at the non-stop position.

In an embodiment of the disclosure, the operating element has an abutting portion, and the stopper has a protruding post, and the abutting portion is adapted to push against the protruding post to move the stopper from the stop position to the non-stop position.

In an embodiment of the disclosure, the expansion card installation module further includes a guide rail disposed on the expansion-card bracket. The guide rail is adapted to guide the expansion card to move into the expansion-card bracket along a moving path.

In an embodiment of the disclosure, part of the driving component is disposed in the guide rail and located on the moving path of the expansion card, and is adapted to be pushed by the expansion card.

In an embodiment of the disclosure, the driving component includes a locking member and a linkage member, the locking member is slidably disposed on the expansion-card bracket, and the linkage member is pivoted on the expansion-card bracket. One end of the linkage member is disposed in the guide rail, and the other end of the linkage member is connected to the locking member. The linkage member is adapted to be pushed by the expansion card to drive the locking member to separate from the stopper.

In an embodiment of the disclosure, the locking member has a hook, and the stopper has a protruding portion. The hook is adapted to engage with the protruding portion, such that the stopper is positioned at the non-stop position.

In an embodiment of the disclosure, the driving component includes a locking member, and the locking member is slidably disposed on the expansion-card bracket. One end of the locking member is partially disposed in the guide rail and is adapted to be pushed by the expansion card to drive the locking member to separate from the stopper.

In an embodiment of the disclosure, the other end of the locking member has a tongue portion adapted to block the stopper at the non-stop position.

In an embodiment of the disclosure, the expansion card installation module further includes a first elastic member. The first elastic member is connected between the driving component and the expansion-card bracket. The driving component is adapted to be positioned at the stopper by the elastic force of the first elastic member.

In an embodiment of the disclosure, the expansion card installation module further includes a second elastic member. The second elastic member is connected between the stopper and the expansion-card bracket. The stopper is adapted to move from the non-stop position to the stop position by the elastic force of the second elastic member.

In an embodiment of the disclosure, the expansion card installation module further includes a positioning member disposed on the expansion-card bracket and adapted to cooperate with the operating element.

In an embodiment of the disclosure, the operating element is pivoted on the expansion-card bracket along a pivot axis, the stopper is slidably disposed on the expansion-card bracket along a sliding direction, and the pivot axis is perpendicular to the sliding direction.

The server of the disclosure includes a chassis, an expansion card, and an expansion card installation module. The expansion card installation module is disposed in the chassis and is adapted to accommodate the expansion card. The expansion card installation module includes an expansion-card bracket, an operating element, a stopper, and a driving component. The operating element is pivoted on the expansion-card bracket. The stopper is slidably disposed on the expansion-card bracket and is located at a stop position or a non-stop position. The stopper at the stop position stops the expansion card in the expansion-card bracket, and the stopper at the non-stop position releases the expansion card, such that the expansion card is allowed to be removed from the expansion-card bracket. The driving component is movably disposed on the expansion-card bracket. The operating element is adapted to push the stopper to move the stopper from the stop position to the non-stop position, and the driving component is adapted to position the stopper at the non-stop position.

In an embodiment of the disclosure, the operating element of the expansion card installation module has an abutting portion, the stopper has a protruding post, and the abutting portion is adapted to push against the protruding post to move the stopper from the stop position to the non-stop position.

In an embodiment of the disclosure, the expansion card installation module further includes a guide rail, and the guide rail is disposed on the expansion-card bracket. The guide rail is adapted to guide the expansion card to move into the expansion-card bracket along a moving path.

In an embodiment of the disclosure, part of the driving component of the expansion card installation module is disposed in the guide rail and located on the moving path of the expansion card, and is adapted to be pushed by the expansion card.

In an embodiment of the disclosure, the driving component of the expansion card installation module includes a locking member and a linkage member. The locking member is slidably disposed on the expansion-card bracket, and the linkage member is pivoted on the expansion-card bracket. One end of the linkage member is disposed in the guide rail, and the other end of the linkage member is connected to the locking member. The linkage member is adapted to be pushed by the expansion card to drive the locking member to move away from the stopper.

In an embodiment of the disclosure, the driving component of the expansion card installation module includes a locking member, and the locking member is slidably disposed on the expansion-card bracket. One end of the locking member is partially disposed in the guide rail and is adapted to be pushed by the expansion card to drive the locking member to move away from the stopper.

In an embodiment of the disclosure, the expansion card installation module further includes a first elastic member, and the first elastic member is connected between the driving component and the expansion-card bracket. The driving component is adapted to move away from the stopper by the elastic force of the first elastic member.

In an embodiment of the disclosure, the expansion card installation module further includes a second elastic member, and the second elastic member is connected between the stopper and the expansion-card bracket. The stopper is adapted to move from the non-stop position to the stop position by the elastic force of the second elastic member.

In an embodiment of the disclosure, the expansion card installation module includes a positioning member, and the positioning member is disposed on the expansion-card bracket and is adapted to cooperate with the operating element.

In an embodiment of the disclosure, the operating element is pivoted on the expansion-card bracket along a pivot axis, the stopper is slidably disposed on the expansion-card bracket along a sliding direction, and the pivot axis is perpendicular to the sliding direction.

Based on the above, when installing the expansion card in the expansion card installation module and the server of the disclosure, the user only needs to push the expansion card into the expansion-card bracket to switch the state of the driving component from a locked state to an unlocked state to move the stopper from the non-stop position to the stop position to stop the expansion card, such that the expansion card may be stably installed in the expansion card installation module. To remove the expansion card, the user only needs to switch the state of the operating element from a non-operating state to an operating state, and pull the expansion card out to remove the expansion card. In this light, the operating element, the stopper, and the driving component may be switched between various positions and states to securely install or remove the expansion card without the need of additional tools for installation and disassembly, saving the time and improving the convenience.

To make the features and advantages of the disclosure easier to be understood, the following embodiments are provided and described in detail with the reference to the following drawings.

DESCRIPTION OF THE EMBODIMENTS

Figure 1:
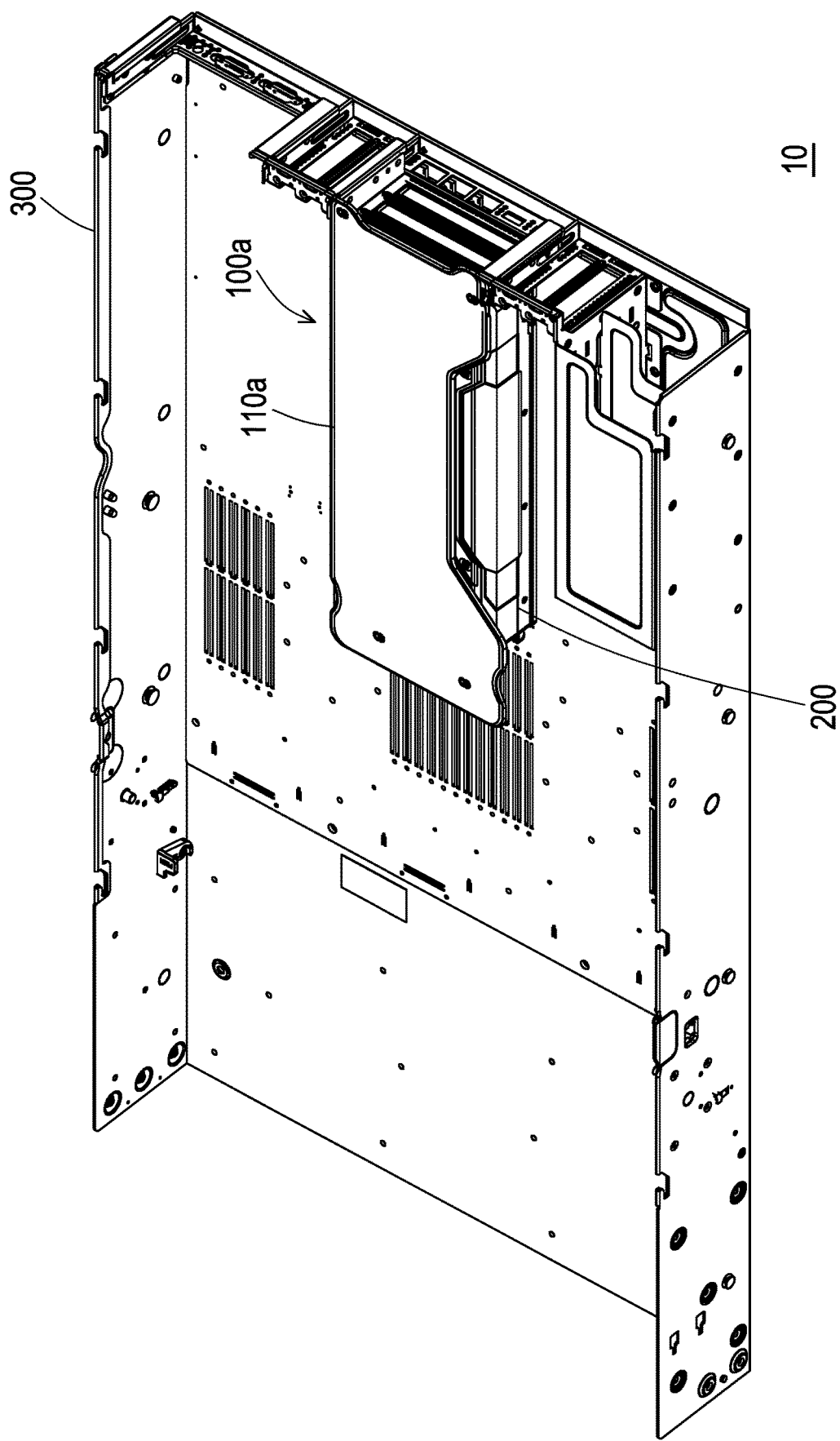
FIG. 1 is a schematic diagram of a server according to an embodiment of the disclosure.

FIG. 1 is a schematic diagram of a server according to an embodiment of the disclosure. In FIG. 1, the server 10 of the disclosure includes an expansion card installation module 100a, an expansion card 200, and a chassis 300. The expansion card installation module 100a is disposed in the chassis 300, and an expansion-card bracket 110a of the expansion card installation module 100a is adapted to accommodate the expansion card 200. The expansion card 200 in this embodiment is, for example, a graphics processor expansion card. In other embodiments, the expansion card 200 may be an interface adapter board, but the disclosure is not limited thereto.

Figure 2A:
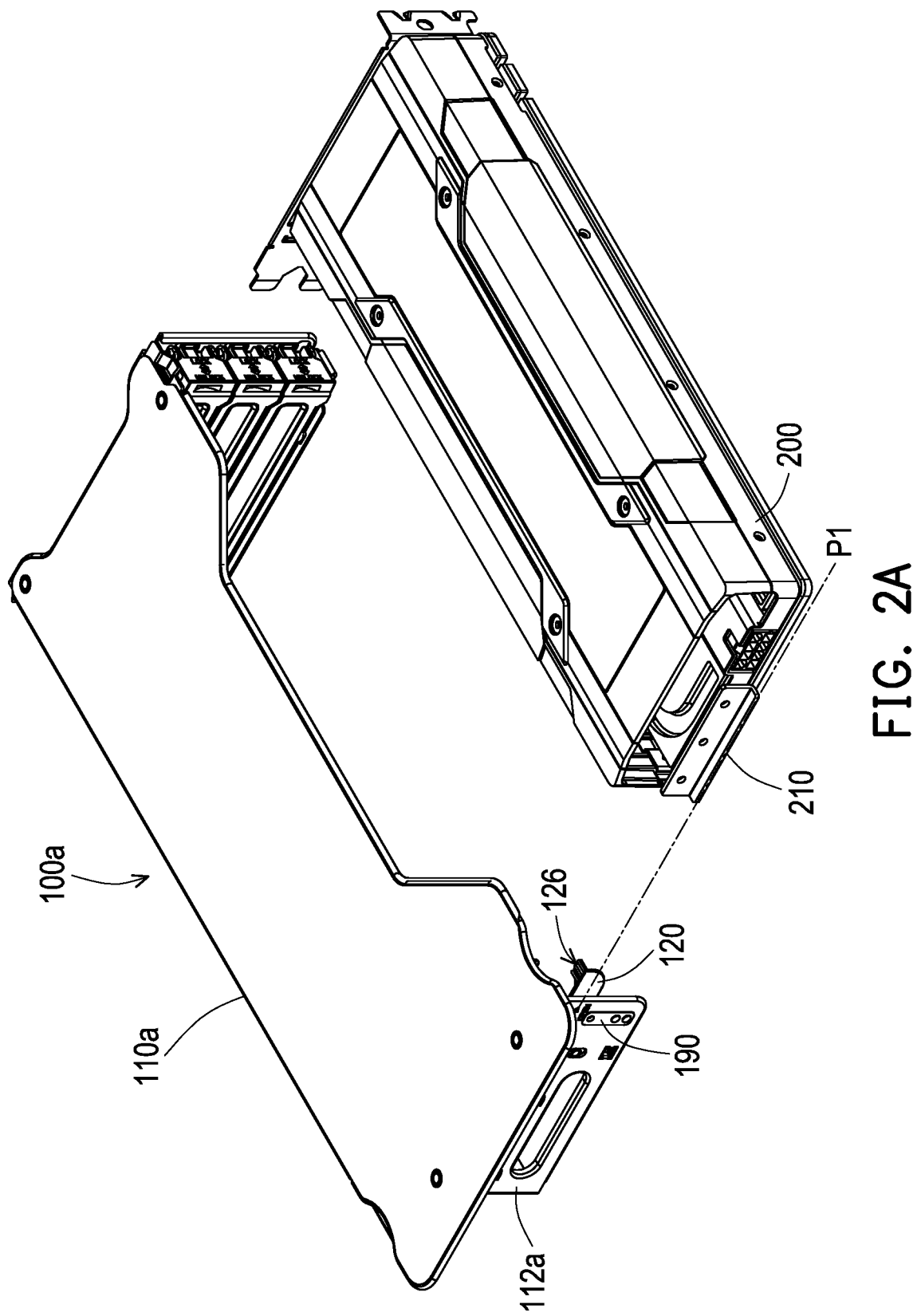
FIG. 2A is a schematic diagram of the expansion card installation module and the expansion card of FIG. 1 before assembly.
Figure 2B:
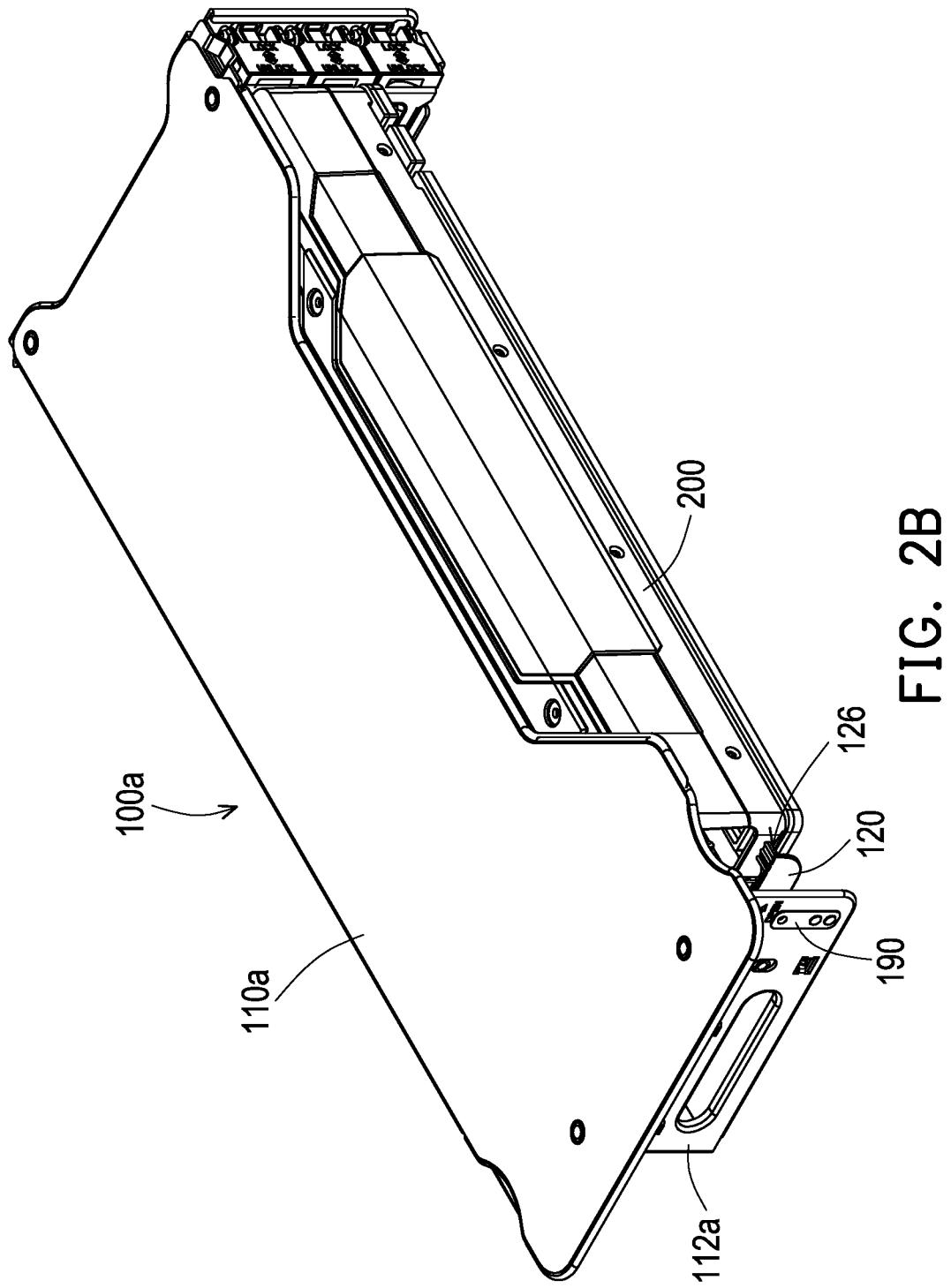
FIG. 2B is a schematic diagram of the expansion card installation module and the expansion card of FIG. 2A assembled.
Figure 2C:
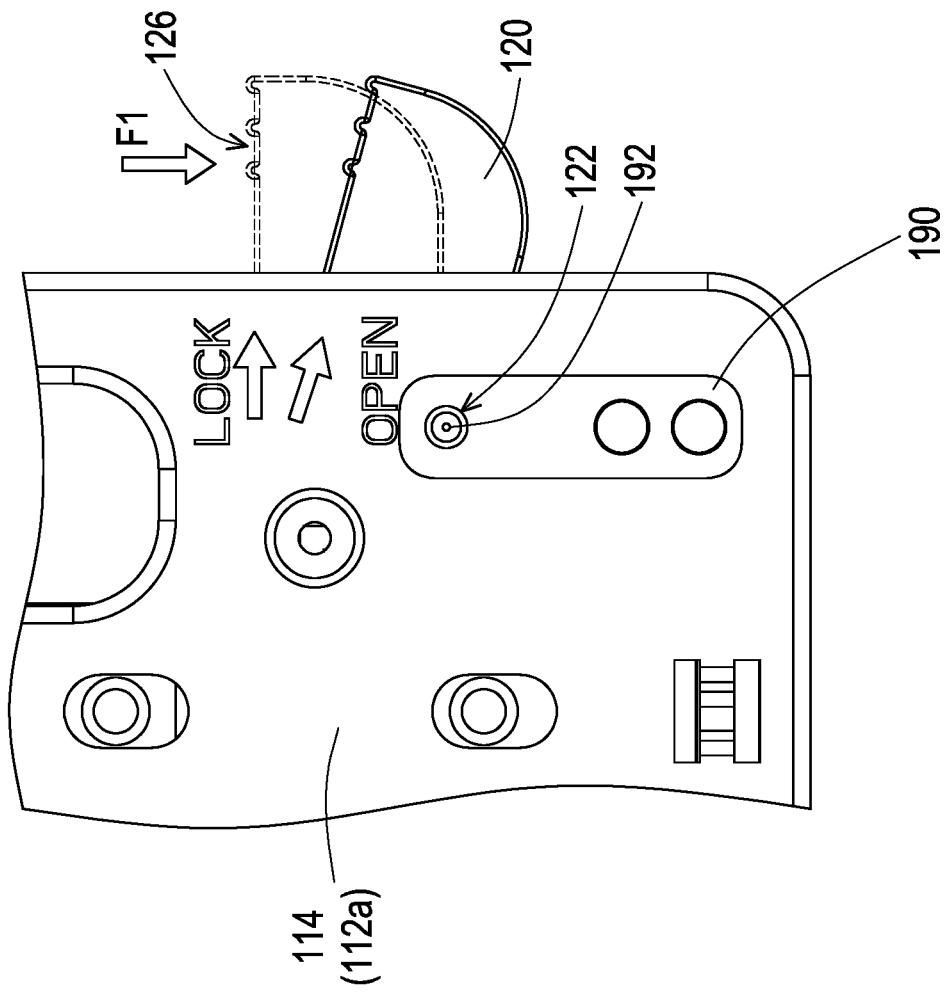
FIG. 2C is a schematic diagram of the operating element of FIG. 2A being switched from a non-operating position to an operating position.

FIG. 2A is a schematic diagram of the expansion card installation module and the expansion card of FIG. 1 before assembly. FIG. 2B is a schematic diagram of the expansion card installation module and the expansion card of FIG. 2A assembled. FIG. 2C is a schematic diagram of the operating element of FIG. 2A being switched from a non-operating position to an operating position. To show the operating element 120 clearly, some elements (e.g., the expansion card 200) are omitted in FIG. 2C. Please refer to FIG. 2A to FIG. 2C at the same time. The expansion card 200 of the present embodiment has a fixing tongue 210, and the operating element 120 of the expansion card installation module 100a is in a non-operating state. To install the expansion card 200, the user only needs to align the fixing tongue 210 of the expansion card 200 with the expansion-card bracket 110a and push it into the expansion-card bracket 110a along a moving path P1 to complete the installation of the expansion card 200 (as shown in FIG. 2B). As shown in FIG. 2C, when the user removes the expansion card 200, the user only needs to apply an external force F1 to an operating portion 126 of the operating element 120 to switch the state of the operating element 120 from a non-operating state (shown in dotted lines) to an operating state (shown in solid lines) to remove the expansion card 200.

Figure 3A:
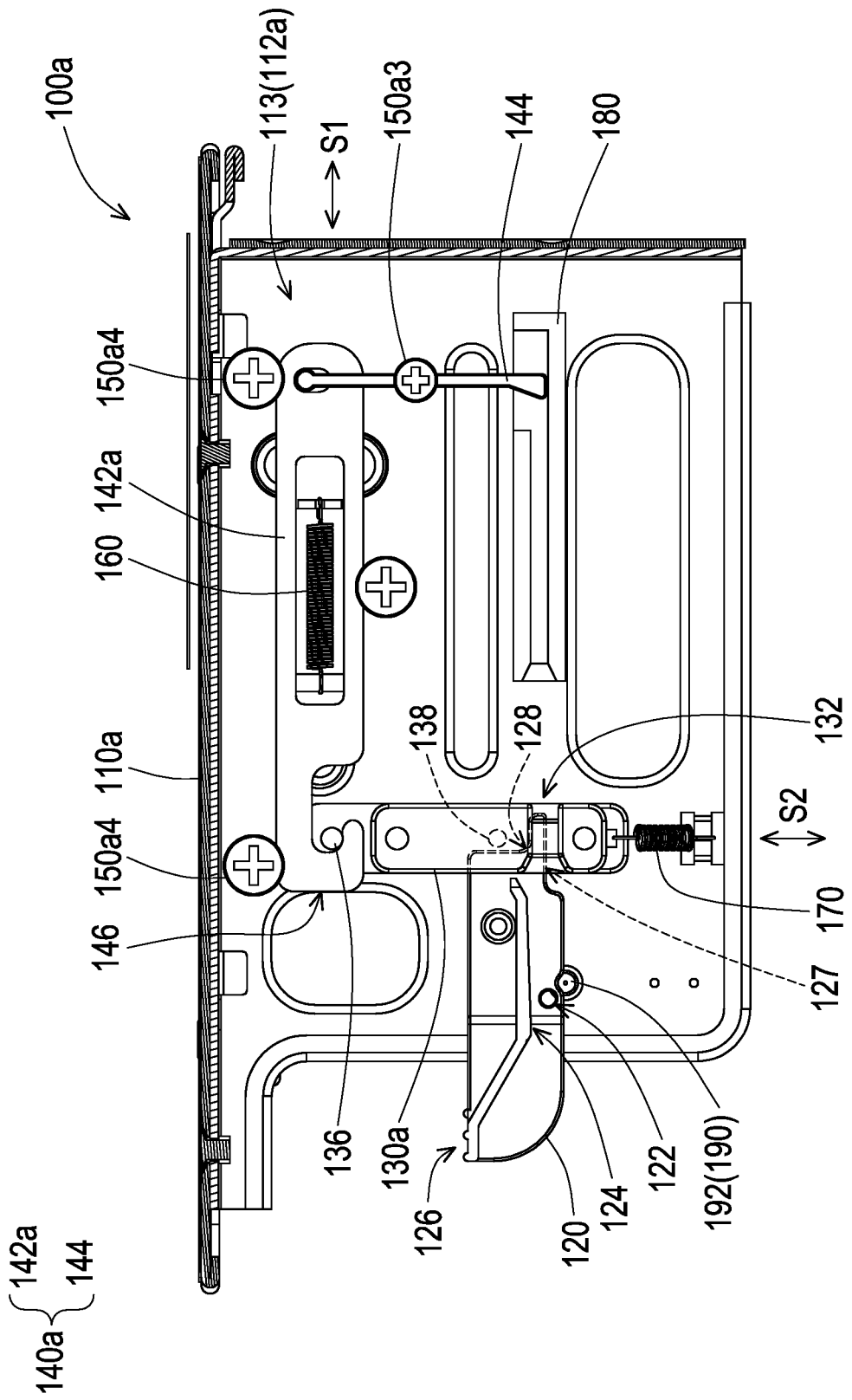
FIG. 3A is a schematic diagram of some components of the expansion card installation module of FIG. 2A.
Figure 3B:
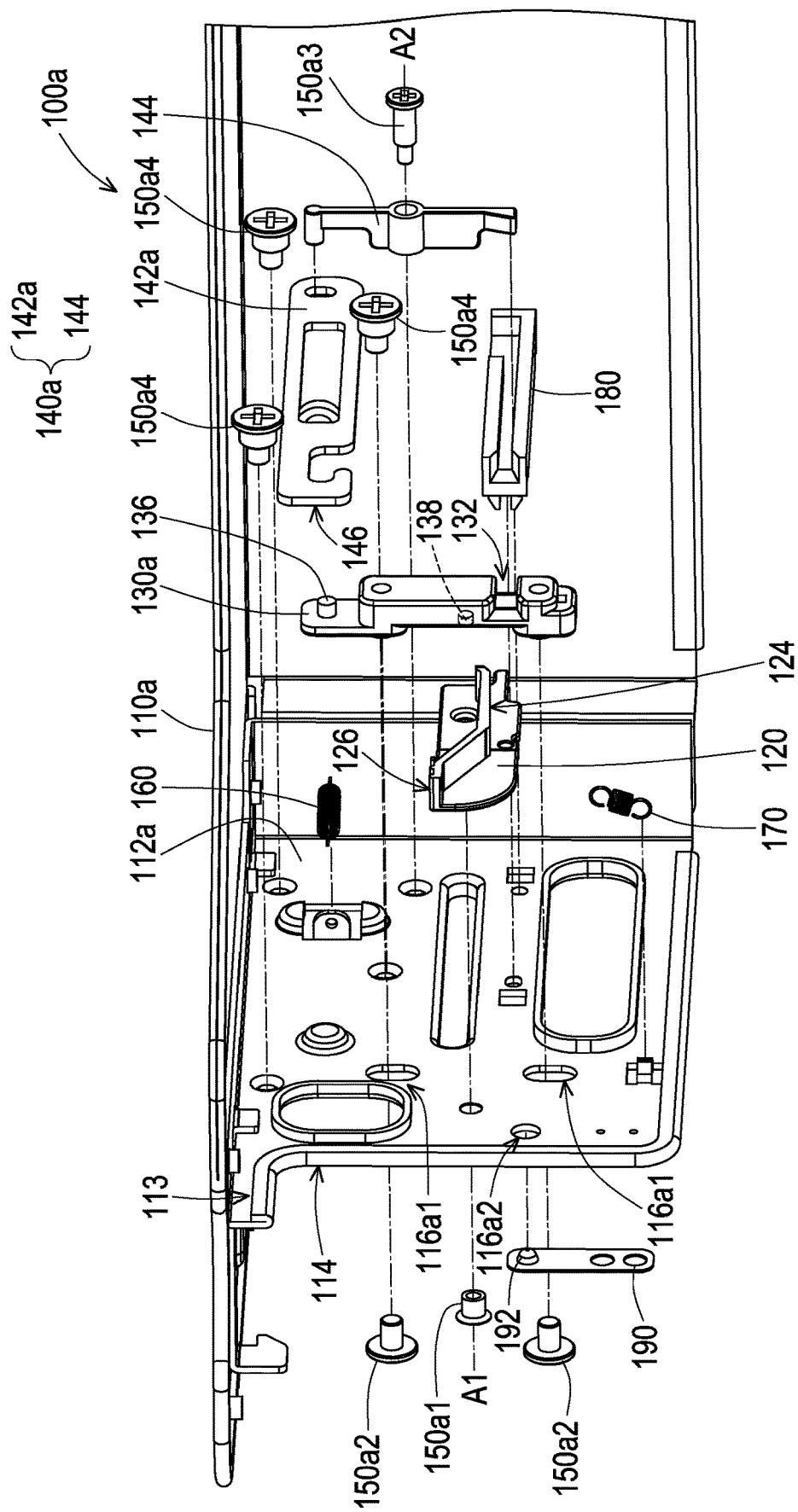
FIG. 3B and FIG. 3C are exploded views showing some components of the expansion card installation module of FIG. 3A from different perspectives.
Figure 3C:
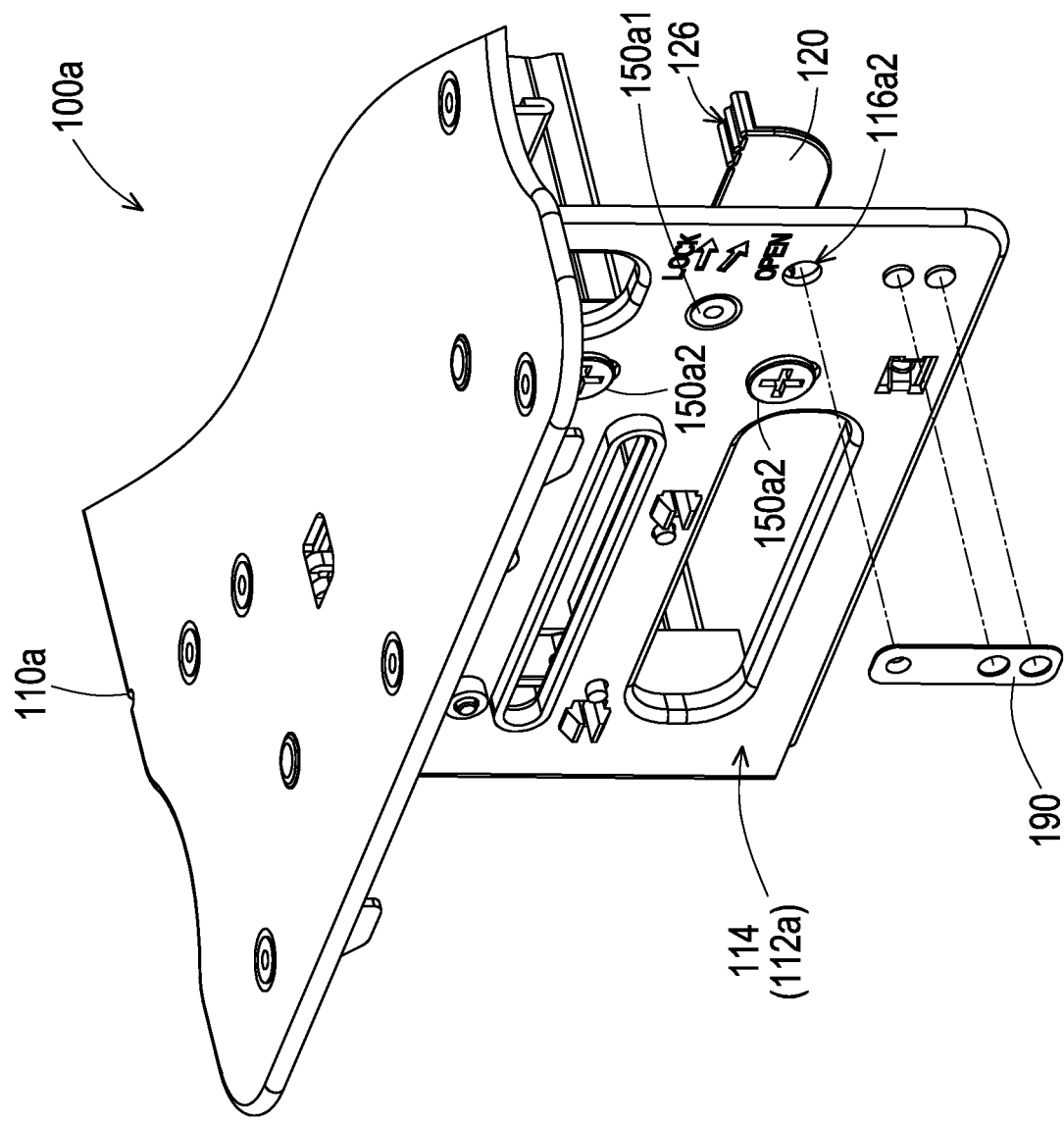

FIG. 3A is a schematic diagram of some components of the expansion card installation module of FIG. 2A. FIG. 3B and FIG. 3C are exploded views showing some components of the expansion card installation module of FIG. 3A from different perspectives. Please refer to FIG. 3A to FIG. 3C at the same time. FIG. 3A shows the expansion card installation module 100a when the expansion card 200 is not installed, which includes the expansion-card bracket 110a, the operating element 120, a stopper 130a, a driving component 140a, and a guide rail 180. Here, the operating element 120 is in a non-operating state, the stopper 130a is in a non-stop position, and the driving component 140a is in a locked state.

Specifically, the operating element 120 of the present embodiment is pivoted on the expansion-card bracket 110a and may be in an operating state or a non-operating state. The stopper 130a is slidably disposed on the expansion-card bracket 110a and may be located at a stop position (as shown in FIG. 4C) or a non-stop position. The driving component 140a is movably disposed on the expansion-card bracket 110a to be in a locked state or an unlocked state (as shown in FIG. 4C). The guide rail 180 is disposed on the expansion-card bracket 110a.

As shown in FIG. 3B, the operating element 120, the stopper 130a, the driving component 140a, and the guide rail 180 are disposed on a first surface 113 of a side wall 112a of the expansion-card bracket 110a. The expansion card installation module 100a includes a plurality of fasteners 150a1 to 150a4. The operating element 120 partially protrudes from the side wall 112a and is pivoted to the expansion-card bracket 110a along a pivot axis A1 through the fastener 150a1. Here, the operating element 120 rotates, with the fastener 150a1 as the rotation center.

The side wall 112a further includes a plurality of sliding grooves 116a1 and 116a2, and the fastener 150a2 is connected to the stopper 130a through the sliding groove 116a1, and the fastener 150a2 may slide in the sliding groove 116a1, such that the stopper 130a is slidably disposed on the expansion-card bracket 110a along a sliding direction S2. In this embodiment, the pivot axis A1 is perpendicular to the sliding direction S2, but the disclosure is not limited thereto. As shown in FIG. 3A, an end 127 (shown in dotted lines) of the operating element 120 is accommodated in the stopper 130a. The end 127 has an abutting portion 128, and the abutting portion 128 extends from the end 127 toward the stopper 130a. The stopper 130a has a protruding post 138, and the protruding post 138 protrudes from the stopper 130a toward the side wall 112a. The protruding post 138 is adapted to be pushed against by the abutting portion 128. The operating element 120 in the non-operating state releases the stopper 130a. When the operating element 120 rotates along the pivot axis A1, the abutting portion 128 of the operating element 120 contacts and pushes the protruding post 138 to drive the stopper 130a to slide along the sliding direction S2.

The driving component 140a of this embodiment includes a locking member 142a and a linkage member 144. Here, the linkage member 144 is pivoted to the expansion-card bracket 110a along another pivot axis A2 through the fastener 150a3, and the linkage member 144 rotates, with the fastener 150a3 as the rotation center. In this embodiment, one end of the linkage member 144 is disposed in the guide rail 180 while the other end of the linkage member 144 is connected (pivoted) to the locking member 142a. One end of the linkage member 144 is adapted to be pushed by the expansion card 200 (the fixing tongue 210), such that the other end of the linkage member 144 moves in the opposite direction, and the locking member 142a is driven to slide along another sliding direction S1 and move away from the stopper 130a.

Figure 4A:
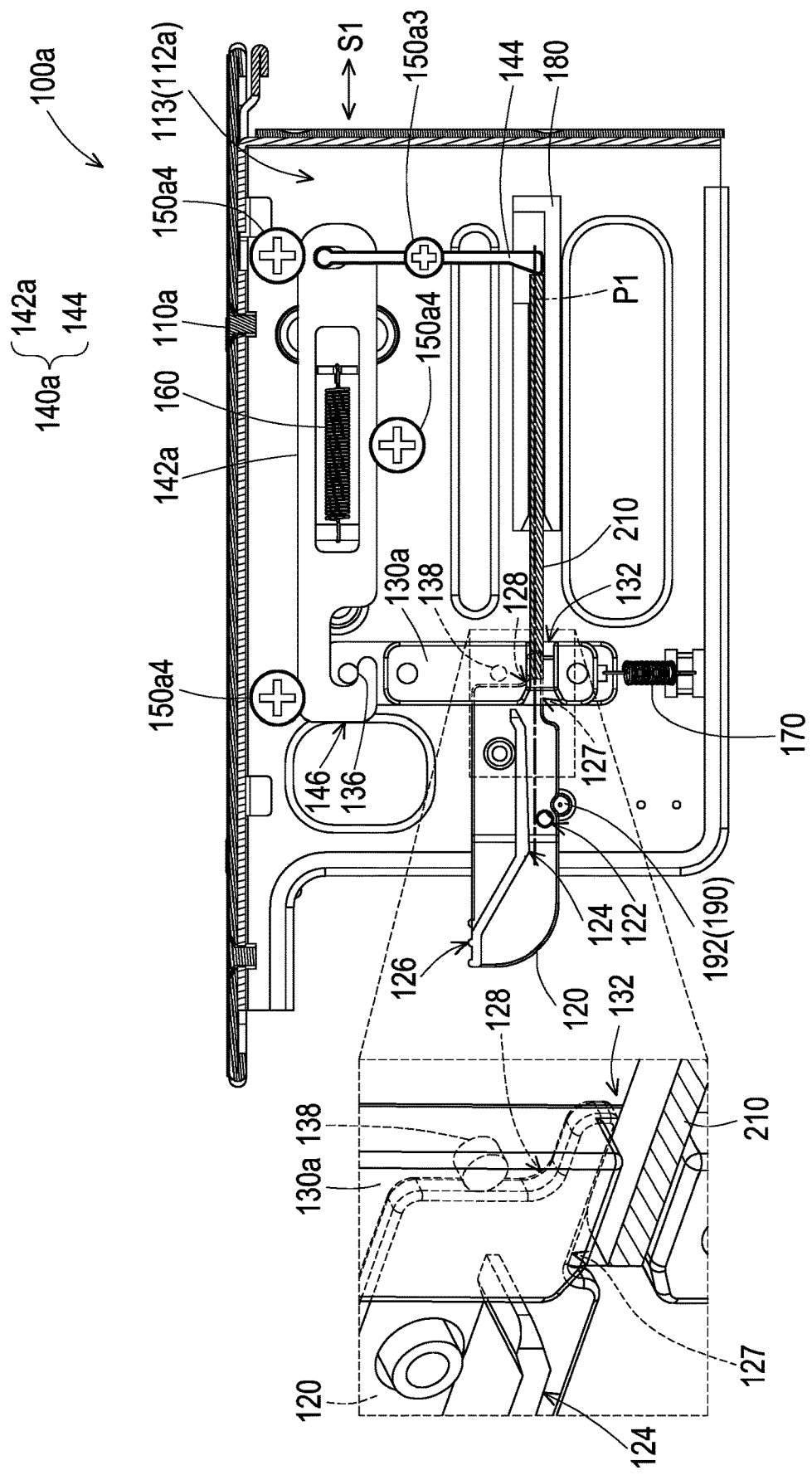
FIG. 4A to FIG. 4C illustrate the process of installing the expansion card of FIG. 2A to the expansion card installation module.
Figure 4B:
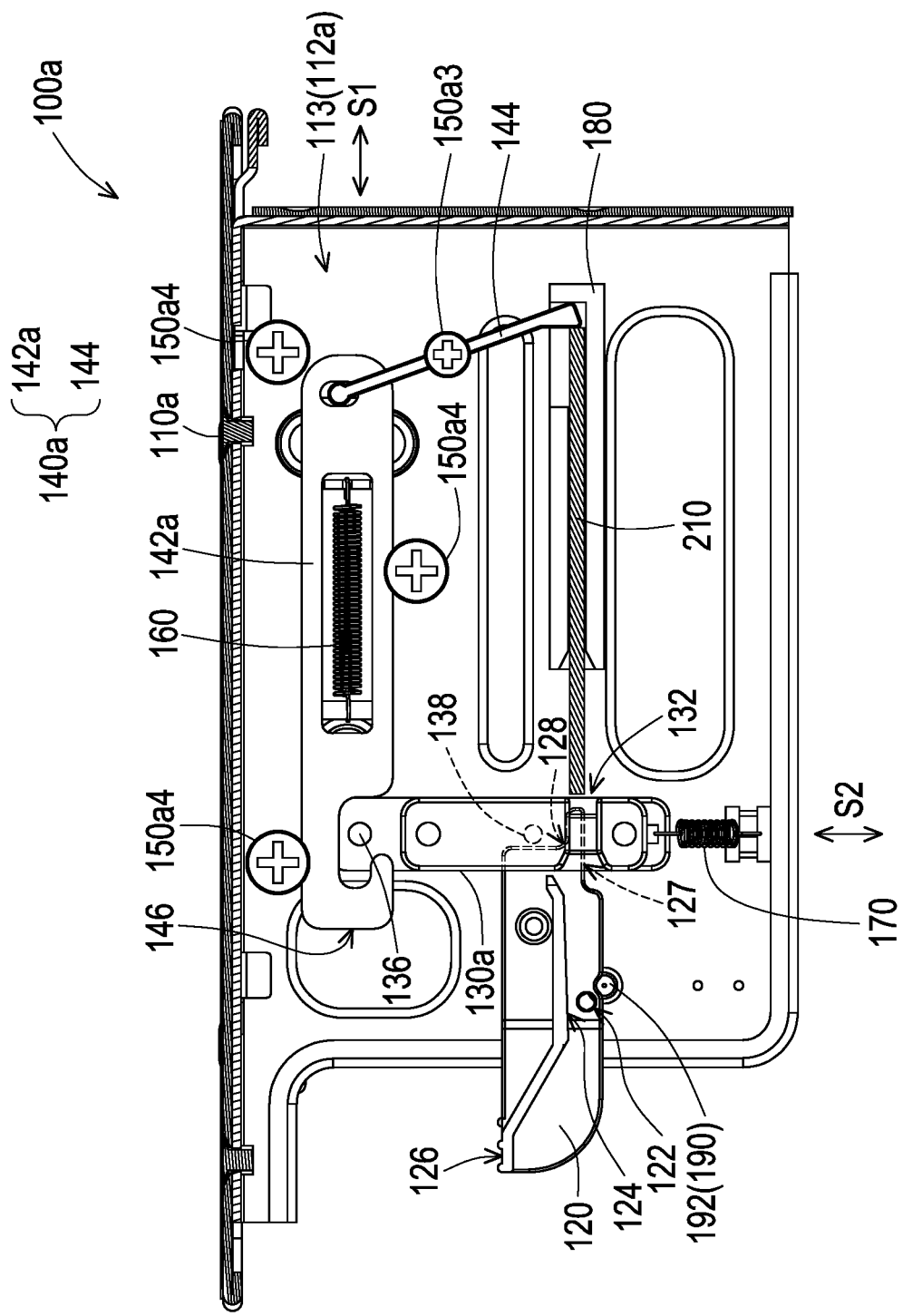
Figure 4C:
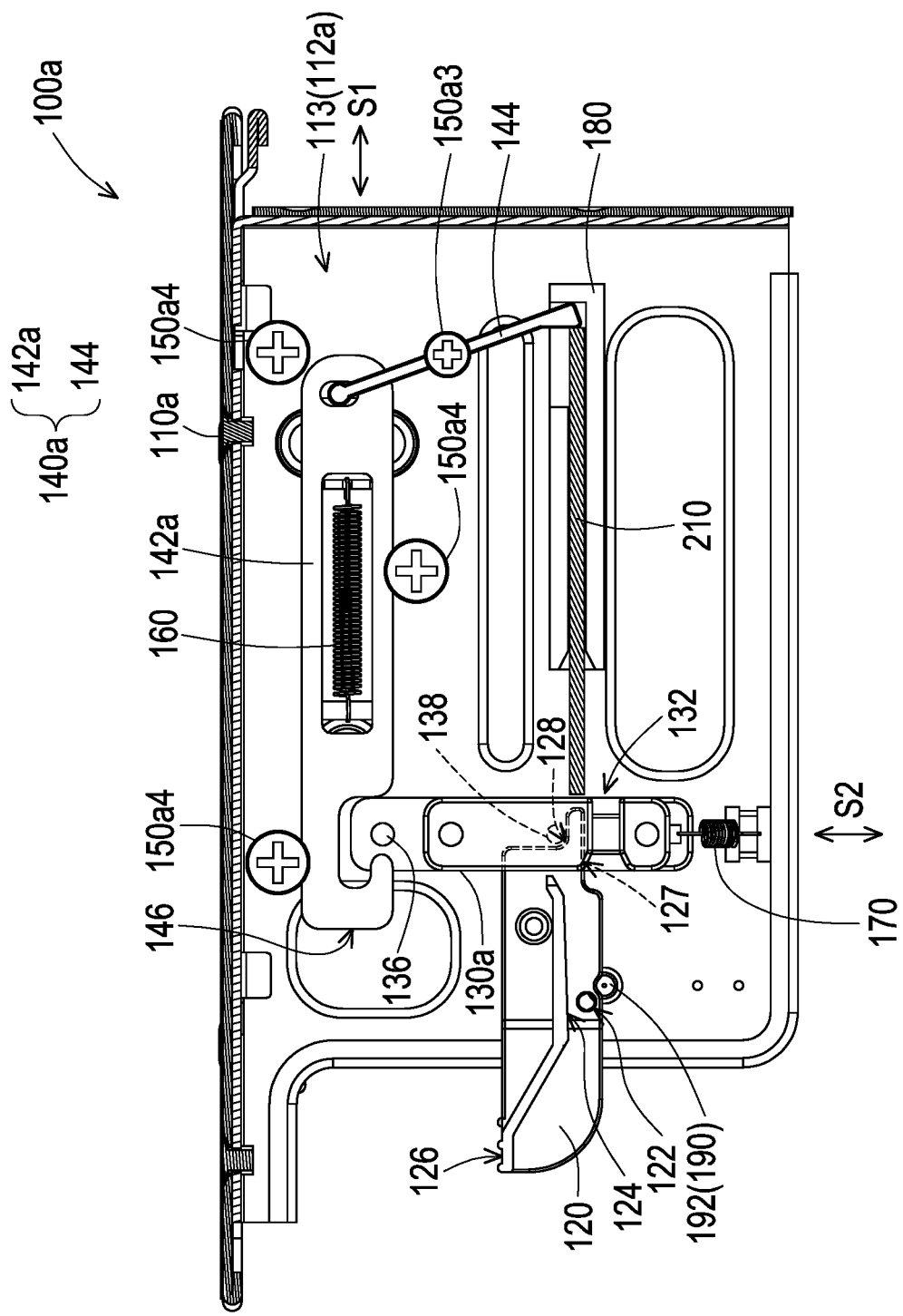

The locking member 142a is slidably disposed on the expansion-card bracket 110a and may be located at a locking position (as shown in FIG. 4A) or an unlocked position (as shown in FIG. 4C). Here, the fastener 150a4 is adapted to limit the locking member 142a, such that the locking member 142a does not deflect or slide in other directions when it is sliding. In short, the locking member 142a of the driving component 140a in this embodiment is slidably disposed on the expansion-card bracket 110a, and the linkage member 144 of the driving component 140a is pivoted on the expansion-card bracket 110a.

In addition, one end of the locking member 142a in this embodiment has a hook 146, and one end of the stopper 130a has a protruding portion 136 protruding in a direction away from the side wall 112a. When the locking member 142a is located at the locking position, the hook 146 is engaged with the protruding portion 136 to position the stopper 130a at the non-stop position. In other words, the driving component 140a in the locked state (i.e., the locking member 142a in the locked position) locks the stopper 130a at the non-stop position. In this light, the driving component 140a is adapted to position the stopper 130a at the non-stop position.

The guide rail 180 of this embodiment is adapted to guide the fixing tongue 210 of the expansion card 200 to move into the expansion-card bracket 110a along a moving path P1 (as shown in FIG. 2A), and part of the driving component 140a (i.e., one end of the linkage member 144) is disposed in the guide rail 180 and located on the moving path P1 of the expansion card 200 and is adapted to be pushed by the expansion card 200.

Figure 5A:
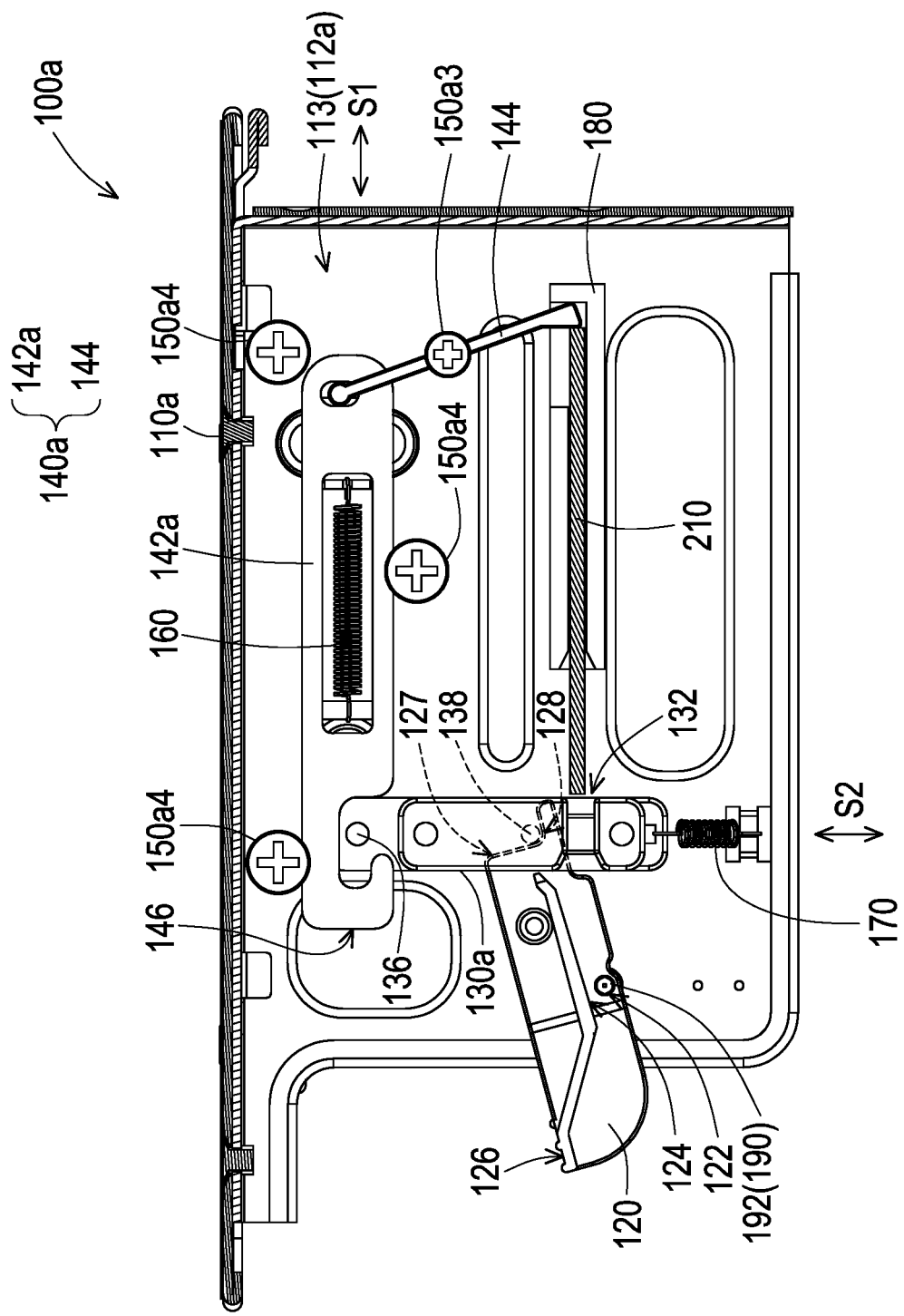
FIG. 5A to FIG. 5C illustrate the process of removing the expansion card of FIG. 4C from the expansion card installation module.

As shown in FIG. 3B and FIG. 3C, the expansion card installation module 100a of this embodiment includes a positioning member 190. The positioning member 190 is disposed on a second surface 114 of the side wall 112a of the expansion-card bracket 110a and cooperates with the operating element 120. The positioning member 190 may be an elastic member, but the disclosure is not limited thereto. Specifically, a protrusion 192 of the positioning member 190 passes through the sliding groove 116a2 of the side wall 112a. As shown in FIG. 3A, when the operating element 120 is in a non-operating state, the protrusion 192 abuts on a side of the operating element 120 to keep the operating element 120 in the non-operating state. When the user applies an external force F1 (as shown in FIG. 2C) to the operating portion 126 of the operating element 120, the operating element 120 pushes the protrusion 192 to deform the positioning member 190 slightly until the operating element 120 is in the operating state (as shown in FIG. 5A) to engage the protrusion 192 with a hole 122 of the operating element 120 to keep the operating element 120 in an operating state. In this light, the positioning member 190 is adapted to position the operating element 120 in the operating state or the non-operating state, and the operating element 120 is adapted to resist the elastic force of the positioning member 190 to be released from the operating state or the non-operating state.

In FIG. 3A again, the expansion card installation module of this embodiment further includes a first elastic member 160 and a second elastic member 170. The first elastic member 160 is connected between the driving component 140a and the expansion-card bracket 110a, and more specifically, the first elastic member 160 is connected between the locking member 142a and the expansion-card bracket 110a. The second elastic member 170 is connected between the stopper 130a and the expansion-card bracket 110a. When the expansion card 200 is not installed, the first elastic member 170 is not deformed, and the second elastic member 170 is deformed and accumulates elastic force.

FIG. 4A to FIG. 4C illustrate the process of installing the expansion card of FIG. 2A to the expansion card installation module. Please refer to FIG. 2A and FIG. 4A to FIG. 4C at the same time. When the stopper 130a is at the non-stop position, the fixing tongue 210 of the expansion card 200 passes through a recess 132 of the stopper 130a and moves along the moving path P1 from the outside of the expansion-card bracket 110a to the inside of the expansion-card bracket 110a, so as to switch the state of the driving component 140a from the locked state (as shown in FIG. 4A) to the unlocked state (as shown in FIG. 4C). Specifically, the fixing tongue 210 passes through the recess 132 and moves into the guide rail 180, and abuts one end of the linkage member 144. As shown in FIG. 4B, the fixing tongue 210 moves and is positioned on the guide rail 180, and one end of the linkage member 144 is pushed by the fixing tongue 210, such that the linkage member 144 may rotate. In addition, FIG. 4A further includes a partially enlarged view, shown in a three-dimensional perspective. As shown in the enlarged view, the part of the operating element 120 accommodated in the stopper 130a and the fixing tongue 210 avoid and not interfere with each other.

When the linkage member 144 rotates, the other end of the linkage member 144 drives the locking member 142a to slide to the unlocked position along the sliding direction S1, and the first elastic member 160 deforms to accumulate the elastic force. The hook 146 of the locking member 142a is away from the protruding portion 136 of the stopper 130. As shown in FIG. 4B and FIG. 4C, the driving component 140a in the unlocked state (i.e., the locking member 142a in the unlocked position) releases the stopper 130a, such that the stopper 130a may move from the non-stop position (as shown in FIG. 4A) to the stop position by the elastic force of the second elastic member 170. In other words, the linkage member 144 is adapted to be pushed by the expansion card 200 to drive the locking member 142a to separate from the stopper 130a. Meanwhile, the second elastic member 170 is not deformed, and the recess 132 of the stopper 130 and the fixing tongue 210 in the way of each other, such that the fixing tongue 210 cannot pass through the recess 132 again to exit the expansion-card bracket 110a. In other words, the stopper 130a at the stop position is adapted to stop the expansion card 200 in the expansion-card bracket 110a, such that the expansion card 200 cannot be removed from the expansion-card bracket 110a.

As described above, when the expansion card 200 is disposed in the expansion-card bracket 110a, the operating element 120 is in the non-operating state, the stopper 130a is at the stop position, the driving component 140a is in the non-locking state, the first elastic member 160 is deformed and accumulates elastic force, and the second elastic member 160 is not deformed, the expansion card 200 may be stably installed on the expansion-card bracket 110a.

Figure 5B:
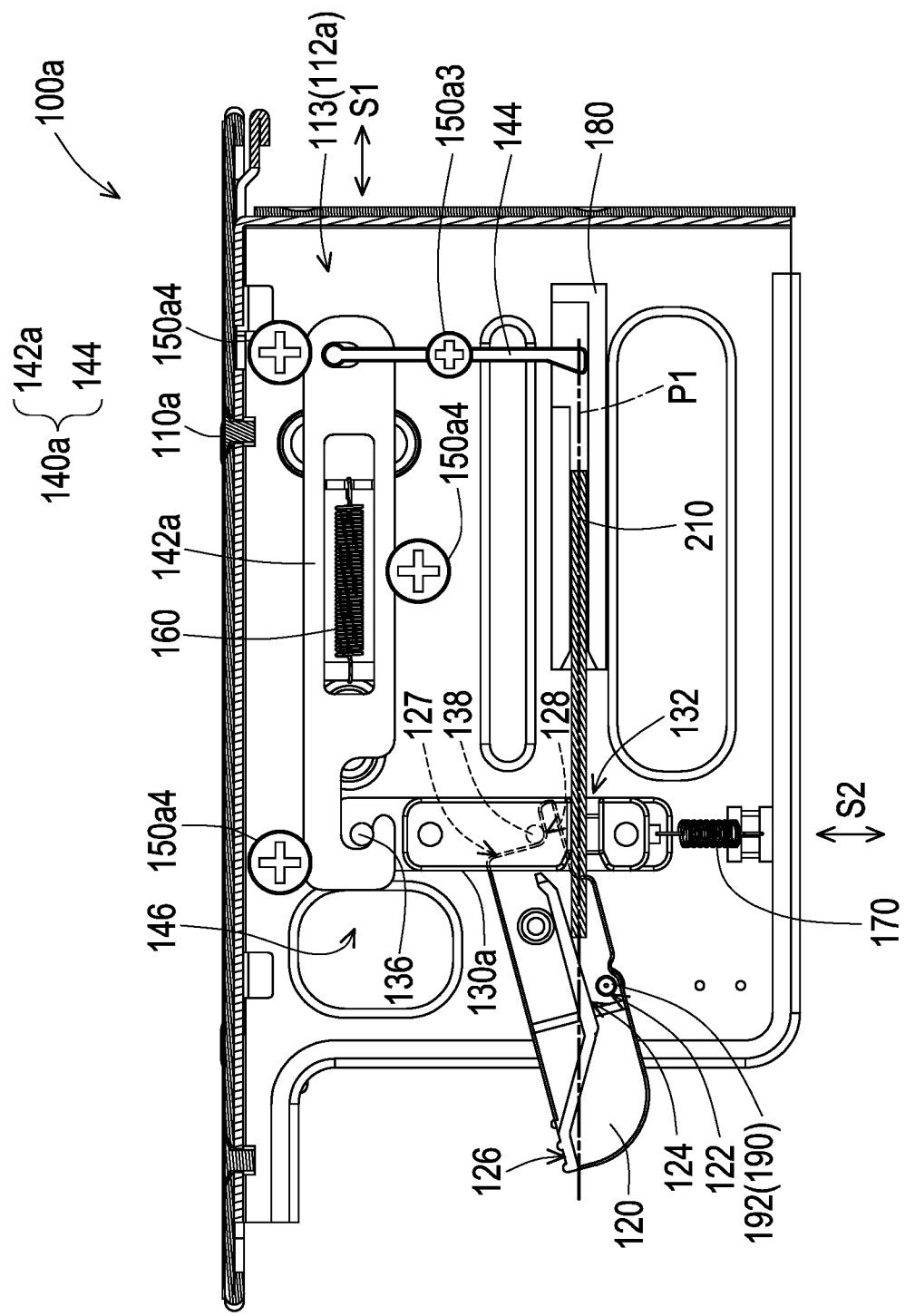
Figure 5C:
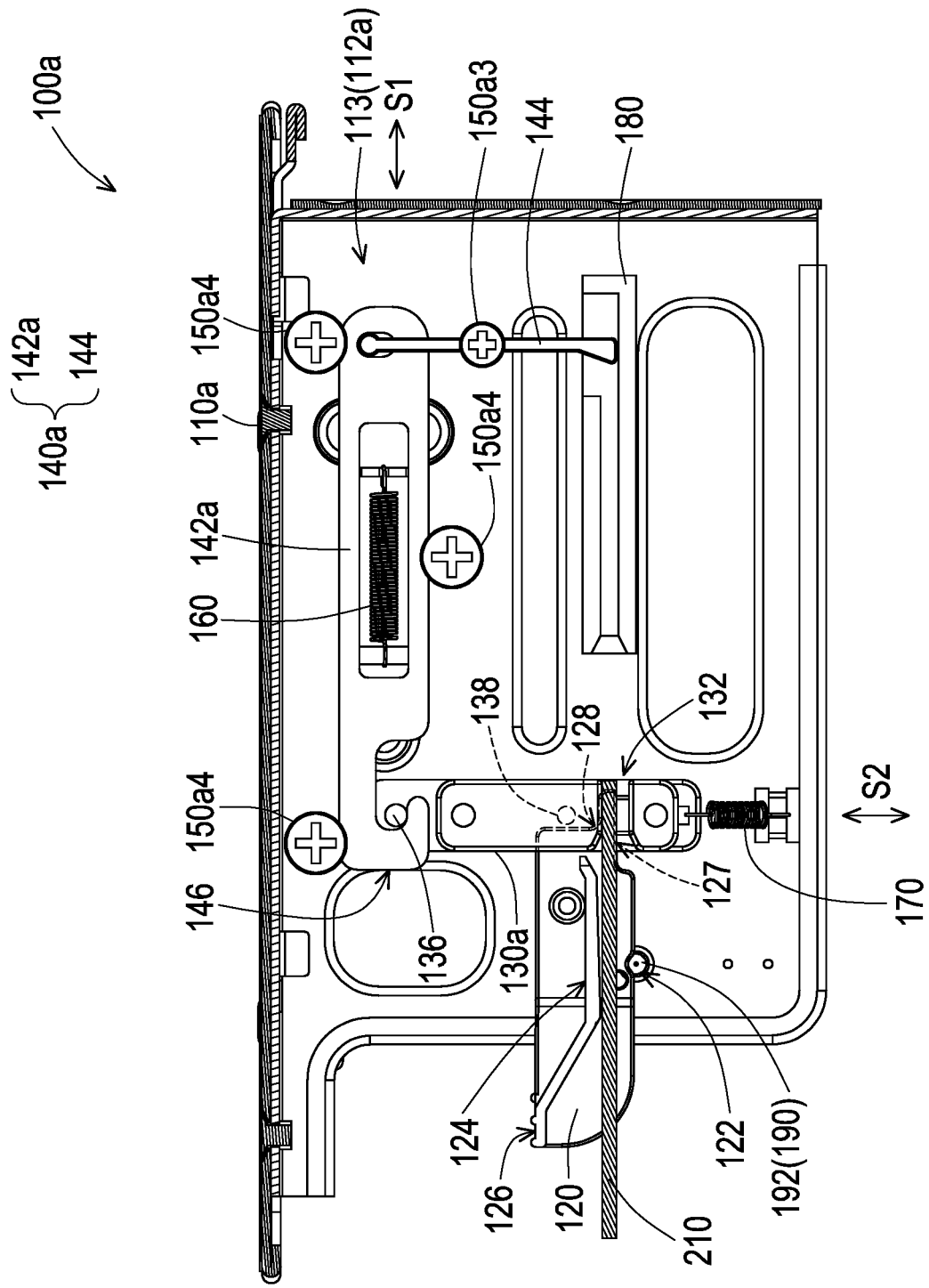

FIG. 5A to FIG. 5C illustrate the process of removing the expansion card of FIG. 4C from the expansion card installation module. Please refer to FIG. 2C and FIG. 5A to FIG. 5C at the same time. When the user wants to remove the expansion card 200 (the fixing tongue 210), the user only needs to apply an external force F1 to the operating portion 126 of the operating element 120 to switch the state of the operating element 120 from the non-operating state to the operating state (as shown in FIG. 2C). As shown in FIG. 5A, when the operating element 120 is switched to the operating state, the abutting portion 128 of the operating element 120 is adapted to contact and push against the protruding post 138, such that the stopper 130a slides from the stop position along the sliding direction S2 to the non-stop block position. In other words, the operating element 120 is adapted to push against the stopper 130a to move the stopper 130a from the stop position to the non-stop position.

The hole 122 of the operating element 120 in the operating state is engaged with the protrusion 192 of the positioning member 190 to keep the operating element 120 in the operating state and limit the stopper 130a to the non-stop position. The recess 132 of the stopper 130a is aligned with the fixing tongue 210, and the fixing tongue 210 may exit the expansion-card bracket 110a through the recess 132. In other words, the stopper 130a at the non-stop position is adapted to release the expansion card 200 (the fixing tongue 210), such that the expansion card 200 is allowed to be removed from the expansion-card bracket 110a.

As shown in FIG. 5B, the fixing tongue 210 of the expansion card 200 moves from the inside of the expansion-card bracket 110a to the outside of the expansion-card bracket 110a along the moving path P1. At this time, the fixing tongue 210 no longer abuts against the linkage member 144, and the linkage member 144 rotates in a clockwise direction to be reset. The locking member 142a of the driving component 140a is driven by the elastic force of the first elastic member 160 and the linkage member 144 to slide from the unlocked position to the locking position along the sliding direction S1, and the hook 146 of the locking member 142a is engaged with the protruding portion 136 of the stopper 130a to lock the stopper 130a at the non-stop position.

The operating element 120 of this embodiment is further provided with a pushing portion 124. As shown in FIGS. 5A and 5B, when the operating element 120 is in the operating state, the pushing portion 124 is positioned on the moving path P1 of the fixing tongue 210. Therefore, when the fixing tongue 210 moves out of the expansion-card bracket 110a, the fixing tongue 210 contacts and pushes the pushing portion 124. As shown in FIG. 5C, when the fixing tongue 210 completely withdraws from the guide rail 180, the pushing portion 124 is pushed by the fixing tongue 210 to switch the state of the operating element 120 from the operating state to the non-operating state. In other words, after the expansion card 200 is removed from the expansion-card bracket 110a, the expansion card installation module 100a automatically returns to the state shown in FIG. 5C (or as shown in FIG. 4A) where there is no expansion card 200 installed, so as to facilitate the next installation of the expansion card 200.

As described above, when installing the expansion card 200, the user only needs to insert the expansion card 200 without the need to operate the expansion card installation module 100a. When removing the expansion card 200, the user only needs to press the operating element 120 and pull out the expansion card 200. As the expansion card 200 is moved out of the expansion-card bracket 110a, the state of the operating element 120 is pushed and switched from the operating state to the non-operating state.

In this way, the expansion card installation module 100a of the present embodiment may have the functions of tool-free installation and removal of the expansion card 200, and the function of automatically resetting the expansion card installation module 100a, which reduces the user's operation steps and improve the convenience thereof, and it is time-saving and convenient.

Figure 6:
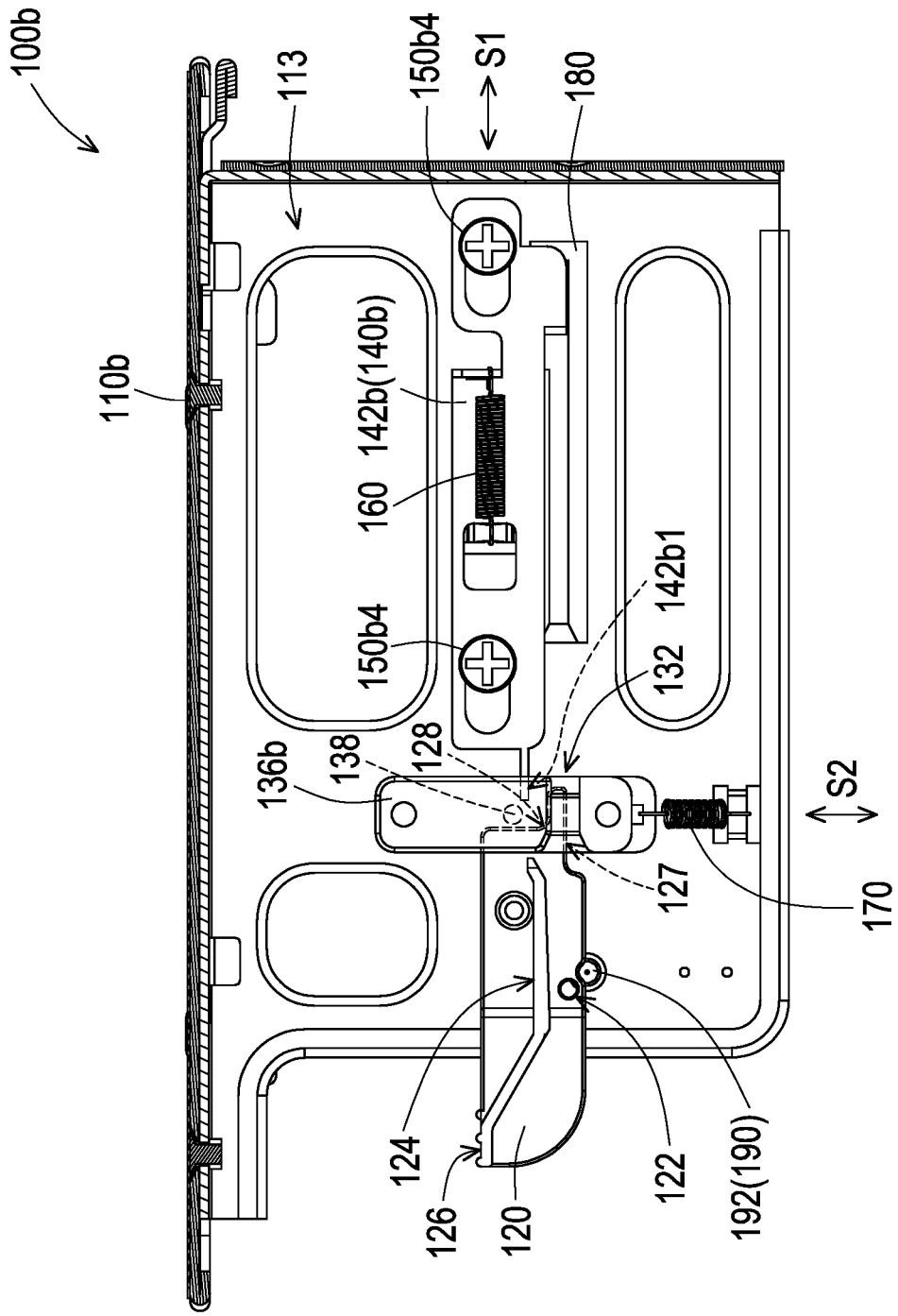
FIG. 6 is a schematic diagram of an expansion card installation module according to another embodiment of the disclosure.
Figure 7A:
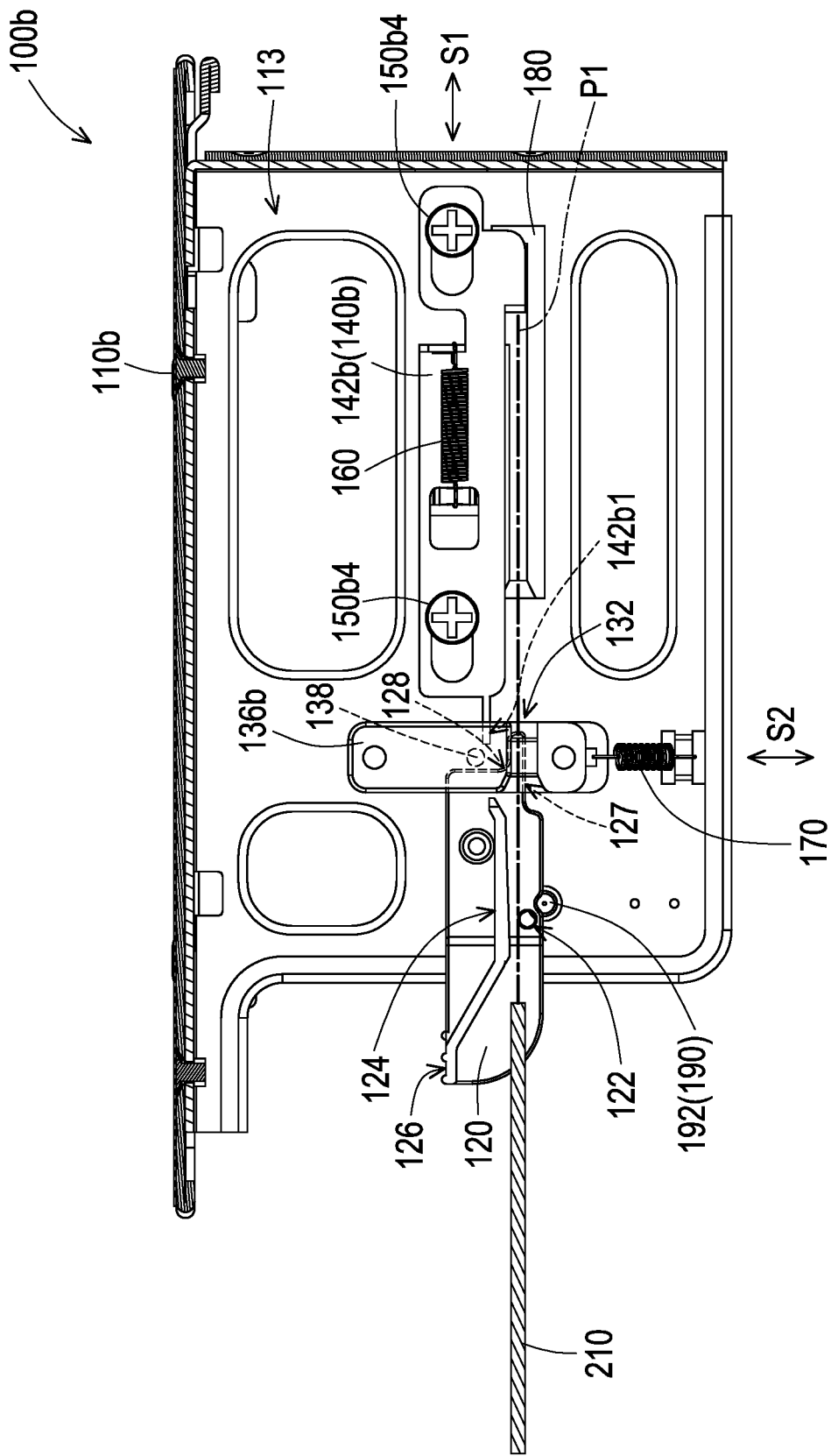
FIG. 7A to FIG. 7C illustrate a process of installing an expansion card to the expansion card installation module of FIG. 6.

FIG. 6 is a schematic diagram of an expansion card installation module according to another embodiment of the disclosure. The expansion card installation module 100b of the embodiment shown in FIG. 6 is similar to that in the previous embodiment, and their difference is that the driving component 140b of the expansion card installation module 100b of this embodiment includes a locking member 142b. Here, the driving component 140b of this embodiment may be regarded as the locking member 142b. The locking member 142b (the driving component 140b) is slidably disposed on the expansion-card bracket 110b through the fastener 150b4. One end of the locking member 142b is partially disposed in the guide rail 180 and on the moving path P1 (as shown in FIG. 7A) of the fixing tongue 210, such that one end of the locking member 142b may be pushed by the expansion card 200 to drive the locking member 142b to separate from the stopper 130b (that is, the locking member 142b moves away from the stopper 130b). In addition, the other end of the locking member 142b has a tongue portion 142b1 extending toward the stopper member 130b, and the tongue portion 142b1 is adapted to stop the stopper member 130b in a non-stop position. When the expansion card 200 is not installed, the tongue portion 142b1 of the locking member 142b in this embodiment locks the stopper 130b, and limits the stopper 130b at the non-stop position.

Figure 7B:
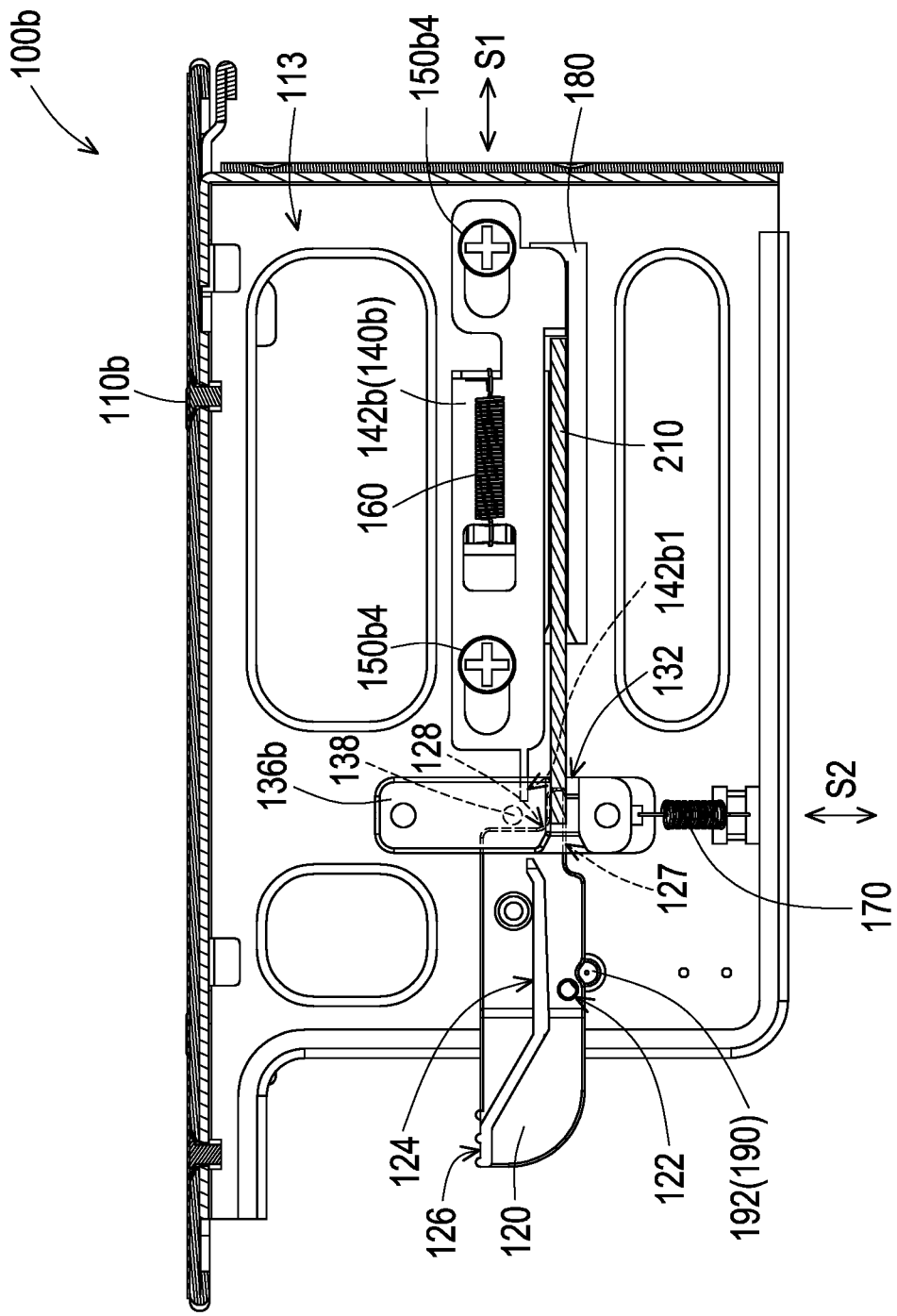
Figure 7C:
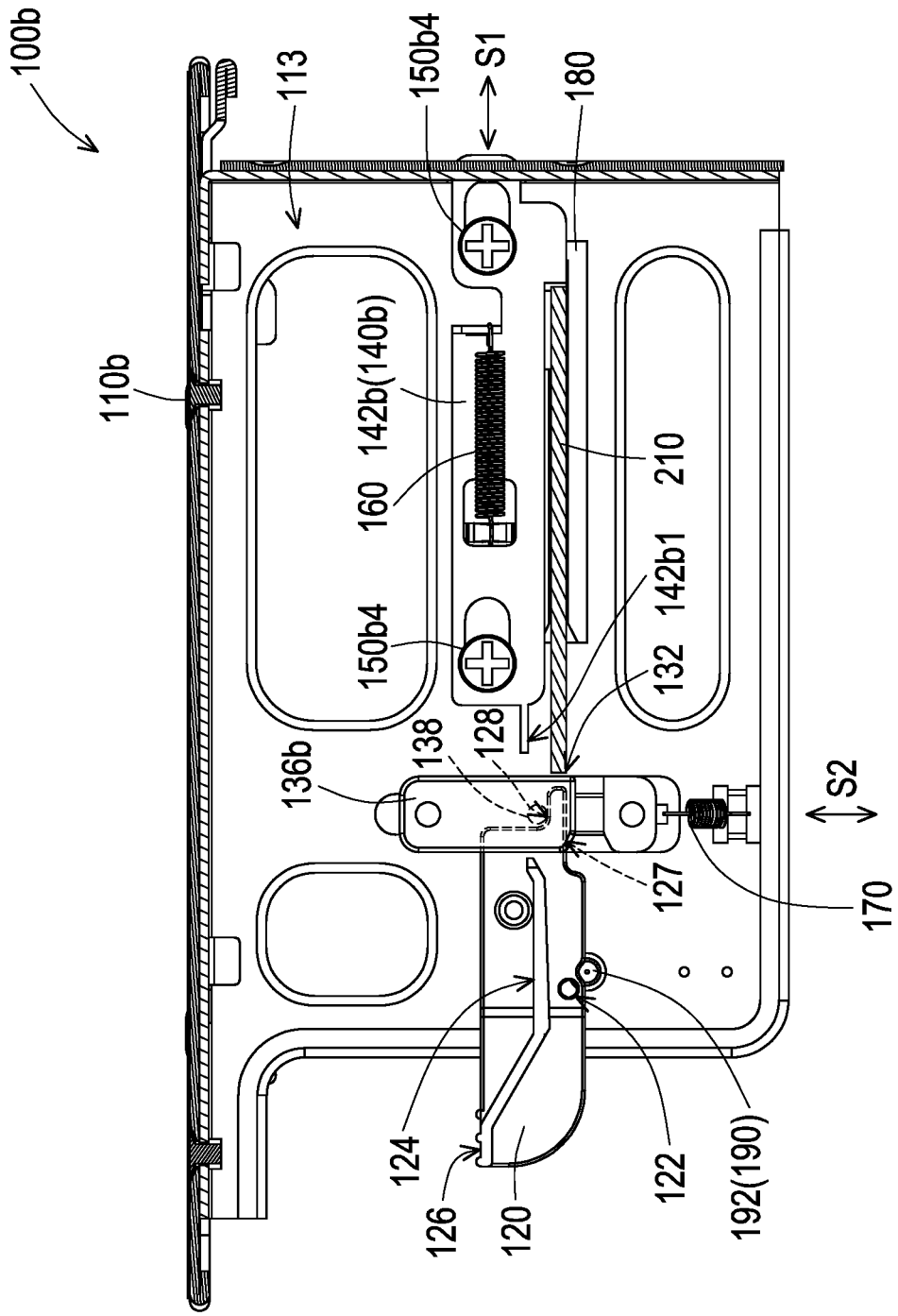

FIG. 7A to FIG. 7C illustrate a process of installing an expansion card to the expansion card installation module of FIG. 6. Please refer to FIG. 7A to FIG. 7C at the same time. The fixing tongue 210 enters the guide rail 180 and pushes against part of the locking member 142b (the driving component 140b). Compared with the locking member 142a of the previous embodiment, the locking member 142b of the present embodiment is directly pushed by the fixing tongue 210 to move from the locking position to the unlocked position (as shown in FIG. 7C). The locking member 142b in the unlocked position releases the stopper 130b, such that the stopper 130b slides from the non-stop position to the stop position (as shown in FIG. 7C) to stop the fixing tongue 210.

Figure 8A:
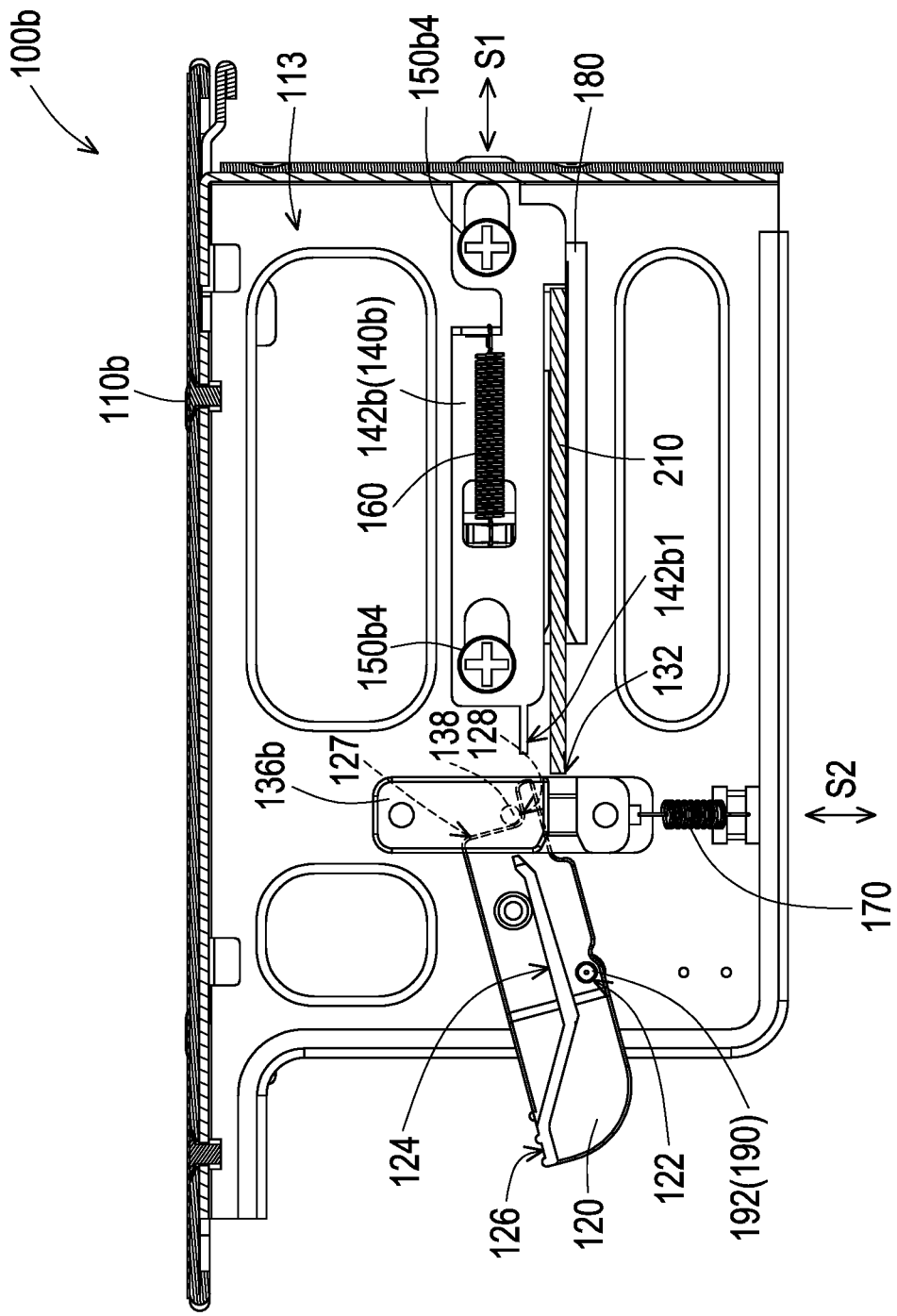
FIG. 8A to FIG. 8C illustrate the process of removing the expansion card of FIG. 7C from the expansion card installation module.
Figure 8B:
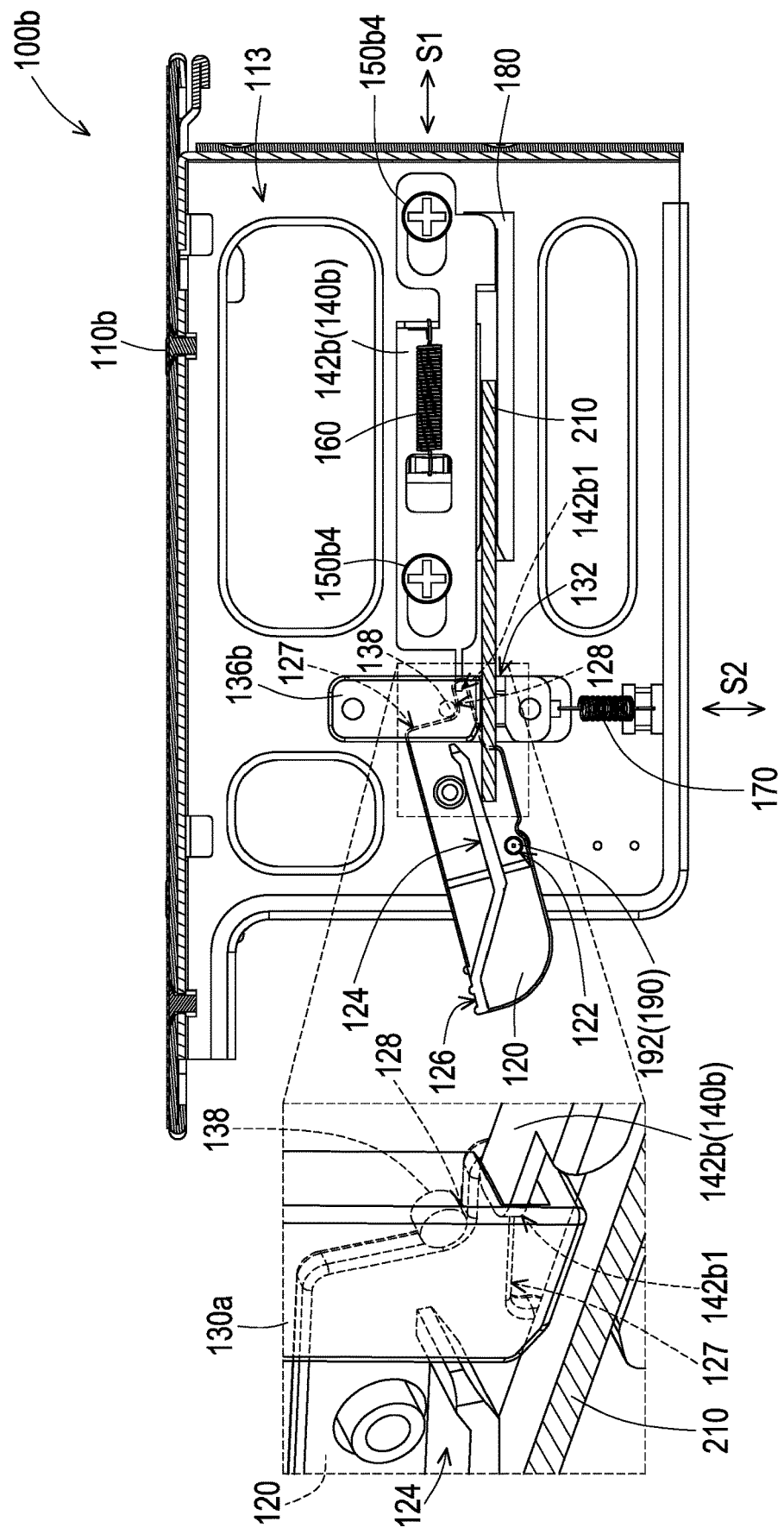
Figure 8C:
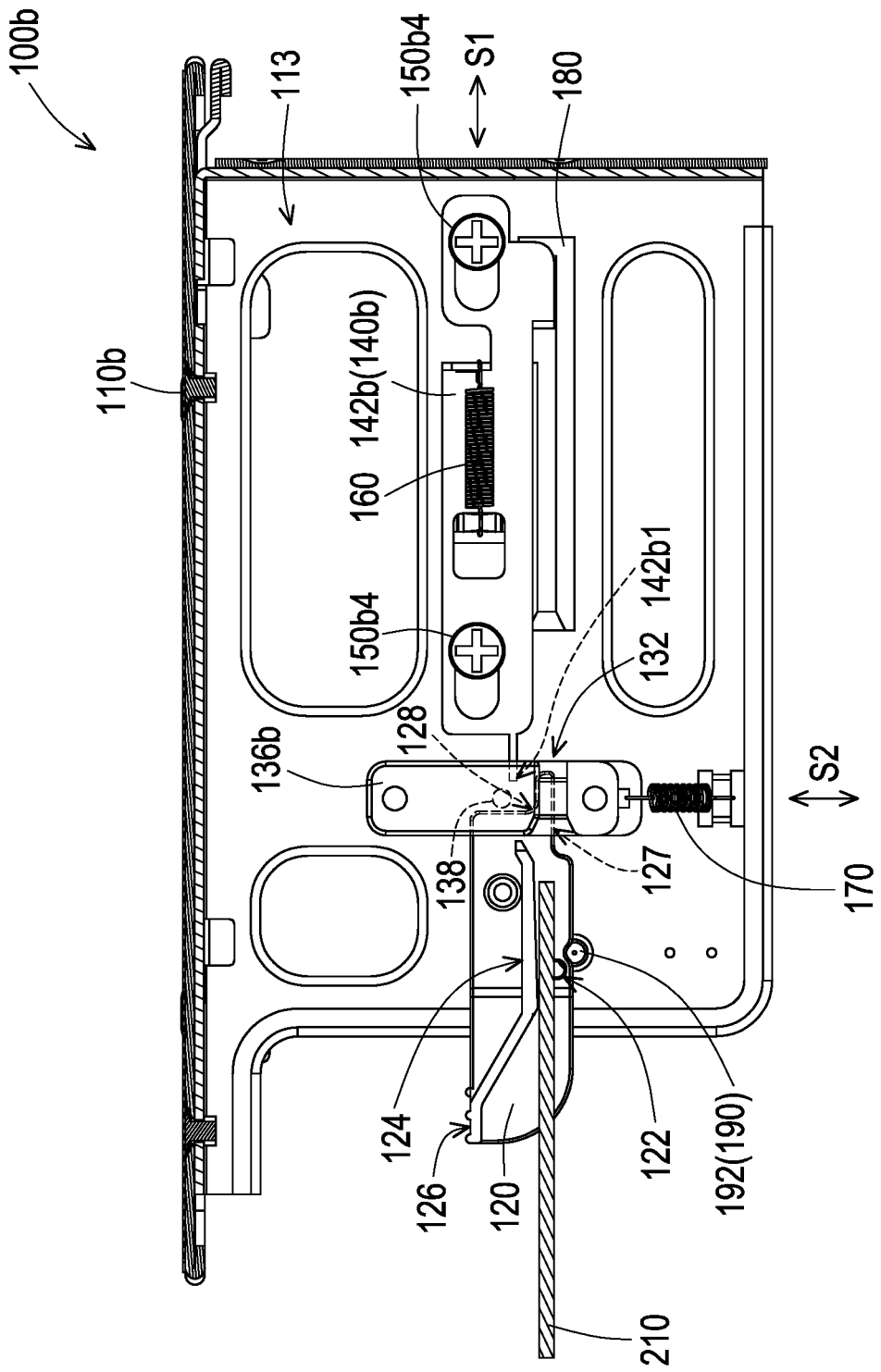

FIG. 8A to FIG. 8C illustrate the process of removing the expansion card of FIG. 7C from the expansion card installation module. Please refer to FIG. 7C and FIG. 8A to FIG. 8C at the same time. The removal process of the expansion card 200 in this embodiment is similar to that in the previous embodiment, and thus the same details are not repeated herein. It is worth mentioning that, as shown in FIG. 8B, when the operating element 120 is in the operating state and the fixing tongue 210 is away from the locking member 142b, the state of the driving component 140a (the locking member 142b) is switched from the unlocking state to the locking state by the elastic force of the first elastic member 160, and the tongue portion 142b1 of the locking member 142b locks the stopper 130b to limit the stopper 130b at the non-stop position.

Note that when the operating element 120 is in the operating state and the locking member 142b is in the locking position, from the perspective shown in FIG. 8B, the right end of the operating element 120 and the tongue portion 142b1 of the locking member 142b overlap each other, but in fact they do not interfere with each other. Specifically, as shown in the partially enlarged area in the stereoscopic view in FIG. 8B, the part where the locking member 142b is accommodated in the stopper 130b and the part where the operating element 120 is accommodated in the stopper 130b actually avoid and not interfere with each other. Therefore, when the operating element 120 is pushed by the fixing tongue 210 and returns to the non-operating state (as shown in FIG. 8C), the position of the stopper 130b and the locking member 142b are not changed thereby.

To sum up, before the expansion card installation module and the server of the disclosure are installed with an expansion card, the operating element is in a non-operating state, the driving component is in a locked state, the stopper is located in a non-stop position, and the driving component locks the stopper. When an expansion card is installed thereto, the expansion card is pushed into the expansion-card bracket, switching the state of the driving component from the locked state to the unlocked state to unlock the stopper, such that the stopper may move from the non-stop position to the stop position to stop the expansion card, and secure the expansion card in the expansion card installation module. When removing the expansion card, the user only needs to switch the state of the operating element from the non-operating state to the operating state to remove the expansion card, and the elements of the expansion card installation module (such as the operating element, the stopper, and the driving component) may be automatically reset and return to the state before the instalment of the expansion card, so as to facilitate the next installation of the expansion card. In this light, an expansion card may be installed to and removed from the expansion card installation module of the disclosure without using additional tools, which saves time and improves the convenience thereof.

Although the disclosure has been disclosed above with embodiments, they are not intended to limit the disclosure. Anyone with ordinary knowledge in the art can make changes and modifications without departing from the spirit and scope of the disclosure. The protection scope of the disclosure shall be determined by the claims attached.

What is claimed is:

1. An expansion card installation module, adapted to accommodate an expansion card, the expansion card installation module comprising:
    an expansion-card bracket;
    an operating element pivoted on the expansion-card bracket;
    a stopper slidably disposed on the expansion-card bracket and located at a stop position or a non-stop position, wherein the stopper at the stop position stops the expansion card in the expansion-card bracket, and the stopper at the non-stop position releases the expansion card, such that the expansion card is allowed to be removed from the expansion-card bracket;
a driving component movably disposed on the expansion-card bracket; and
a guide rail disposed on the expansion-card bracket and adapted to guide the expansion card to move into the expansion-card bracket along a moving path;
wherein the operating element is adapted to push against the stopper to move the stopper from the stop position to the non-stop position, and the driving component is adapted to position the stopper at the non-stop position,
wherein part of the driving component is disposed in the guide rail and located on the moving path of the expansion card, and the part of the driving component is adapted to be pushed by the expansion card.

2. The expansion card installation module as claimed in claim 1, wherein the operating element has an abutting portion, the stopper has a protruding post, and the abutting portion is adapted to push against the protruding post to move the stopper from the stop position to the non-stop position.

3. The expansion card installation module as claimed in claim 1, wherein the driving component comprises a locking member and a linkage member, the locking member is slidably disposed on the expansion-card bracket, the linkage member is pivoted on the expansion-card bracket, one end of the linkage member is disposed in the guide rail, and an another end of the linkage member is connected to the locking member, and the linkage member is adapted to be pushed by the expansion card to drive the locking member to separate from the stopper.

4. The expansion card installation module as claimed in claim 3, wherein the locking member has a hook, the stopper has a protruding portion, and the hook is adapted to engage with the protruding portion, such that the stopper is positioned at the non-stop position.

5. The expansion card installation module as claimed in claim 1, wherein the driving component comprises a locking member, the locking member is slidably disposed on the expansion-card bracket, one end of the locking member is partially disposed in the guide rail and is adapted to be pushed by the expansion card to drive the locking member to separate from the stopper.

6. The expansion card installation module as claimed in claim 5, wherein an another end of the locking member has a tongue portion adapted to block the stopper at the non-stop position.

7. The expansion card installation module as claimed in claim 1, further comprising:
a first elastic member, wherein the first elastic member is connected between the driving component and the expansion-card bracket, and the driving component is adapted to be positioned at the stopper by an elastic force of the first elastic member; and
a second elastic member, wherein the second elastic member is connected between the stopper and the expansion-card bracket, and the stopper is adapted to move from the non-stop position to the stop position by an elastic force of the second elastic member.

8. The expansion card installation module as claimed in claim 1, further comprising a positioning member disposed on the expansion-card bracket and adapted to cooperate with the operating element.

9. The expansion card installation module as claimed in claim 1, wherein the operating element is pivoted on the expansion-card bracket along a pivot axis, the stopper is slidably disposed on the expansion-card bracket along a sliding direction, and the pivot axis is perpendicular to the sliding direction.

10. A server, comprising:
a chassis;
an expansion card; and
an expansion card installation module, disposed in the chassis and adapted to accommodate the expansion card, comprising:
an expansion-card bracket;
an operating element, pivoted on the expansion-card bracket;
a stopper, slidably disposed on the expansion-card bracket and located at a stop position or a non-stop position, wherein the stopper at the stop position stops the expansion card in the expansion-card bracket, and the stopper at the non-stop position releases the expansion card, such that the expansion card is allowed to be removed from the expansion-card bracket;
a driving component, movably disposed on the expansion-card bracket; and
a guide rail disposed on the expansion-card bracket and adapted to guide the expansion card to move into the expansion-card bracket along a moving path,
wherein the operating element is adapted to push against the stopper to move the stopper from the stop position to the non-stop position, and the driving component is adapted to position the stopper at the non-stop position,
wherein part of the driving component of the expansion card installation module is disposed in the guide rail and located on the moving path of the expansion card and is adapted to be pushed by the expansion card.

11. The server as claimed in claim 10, wherein the operating element has an abutting portion, the stopper has a protruding post, and the abutting portion is adapted to push against the protruding post to move the stopper from the stop position to the non-stop position.

12. The server as claimed in claim 10, wherein the driving component of the expansion card installation module comprises a locking member and a linkage member, the locking member is slidably disposed on the expansion-card bracket, the linkage member is pivoted on the expansion-card bracket, one end of the linkage member is disposed in the guide rail, and an another end of the linkage member is connected to the locking member, and the linkage member is adapted to be pushed by the expansion card to drive the locking member to move away the stopper.

13. The server as claimed in claim 10, wherein the driving component of the expansion card installation module comprises a locking member, the locking member is slidably disposed on the expansion-card bracket, one end of the locking member is partially disposed in the guide rail and is adapted to be pushed by the expansion card to drive the locking member to move away from the stopper.

14. The server as claimed in claim 10, wherein the expansion card installation module further comprises:
a first elastic member, wherein the first elastic member is connected between the driving component and the expansion-card bracket, and the driving component is adapted to move away from the stopper by an elastic force of the first elastic member; and
a second elastic member, the second elastic member is connected between the stopper and the expansion-card bracket, and the stopper is adapted to move from the non-stop position to the stop position by an elastic force of the second elastic member.

15. The server as claimed in claim 10, wherein the expansion card installation module further comprises a positioning member disposed on the expansion-card bracket and adapted to cooperate with the operating element.

16. The server as claimed in claim 10, wherein the operating element is pivoted on the expansion-card bracket along a pivot axis, the stopper is slidably disposed on the expansion-card bracket along a sliding direction, and the pivot axis is perpendicular to the sliding direction.

\* \* \* \* \*